(12) United States Patent
Murata et al.

(10) Patent No.: US 7,653,989 B2
(45) Date of Patent: Feb. 2, 2010

(54) SUBSTRATE PROCESSING APPARATUS AND MOUNTER

(75) Inventors: Takahiko Murata, Osaka (JP); Shinjiro Tsuji, Nara (JP); Kozo Odawara, Osaka (JP); Ryouichirou Katano, Osaka (JP)

(73) Assignee: Panasonic Corporation, Osaka (JP)

( * ) Notice: Subject to any disclaimer, the term of this patent is extended or adjusted under 35 U.S.C. 154(b) by 472 days.

(21) Appl. No.: 11/631,518

(22) PCT Filed: Jul. 1, 2005

(86) PCT No.: PCT/JP2005/012619

§ 371 (c)(1),
(2), (4) Date: Jan. 4, 2007

(87) PCT Pub. No.: WO2006/006509

PCT Pub. Date: Jan. 19, 2006

(65) Prior Publication Data

US 2008/0301932 A1        Dec. 11, 2008

(30) Foreign Application Priority Data

Jul. 8, 2004      (JP)  ............................. 2004-202386
Aug. 20, 2004  (JP)  ............................. 2004-241110

(51) Int. Cl.
*B23P 19/00*       (2006.01)

(52) U.S. Cl. ............................. 29/832; 29/740; 29/743; 269/21

(58) Field of Classification Search .................. 29/832, 29/739, 743; 269/21
See application file for complete search history.

(56) References Cited

U.S. PATENT DOCUMENTS

2002/0093130 A1    7/2002    Behler et al.
2002/0157246 A1*  10/2002    Ogimoto .................... 29/832

FOREIGN PATENT DOCUMENTS

EP      0 565 278     10/1993
JP      5-228755      9/1993

* cited by examiner

*Primary Examiner*—Derris H Banks
*Assistant Examiner*—Dan D Le
(74) *Attorney, Agent, or Firm*—Wenderoth, Lind & Ponack, L.L.P.

(57) ABSTRACT

The final-bonder is equipped with a warping correction unit that is equipped in parallel with a backup stage with a distance of about 20 mm from such backup stage, and that includes accordion pads for sucking a liquid crystal panel; the backup stage that supports, from the back, the liquid crystal panel when pressure is applied to its outer edge portion at the bonding of semiconductor components; and a pressure head that carries out final bonding of the semiconductor components onto the outer edge portion of the liquid crystal panel by applying pressure and heat to them.

10 Claims, 22 Drawing Sheets

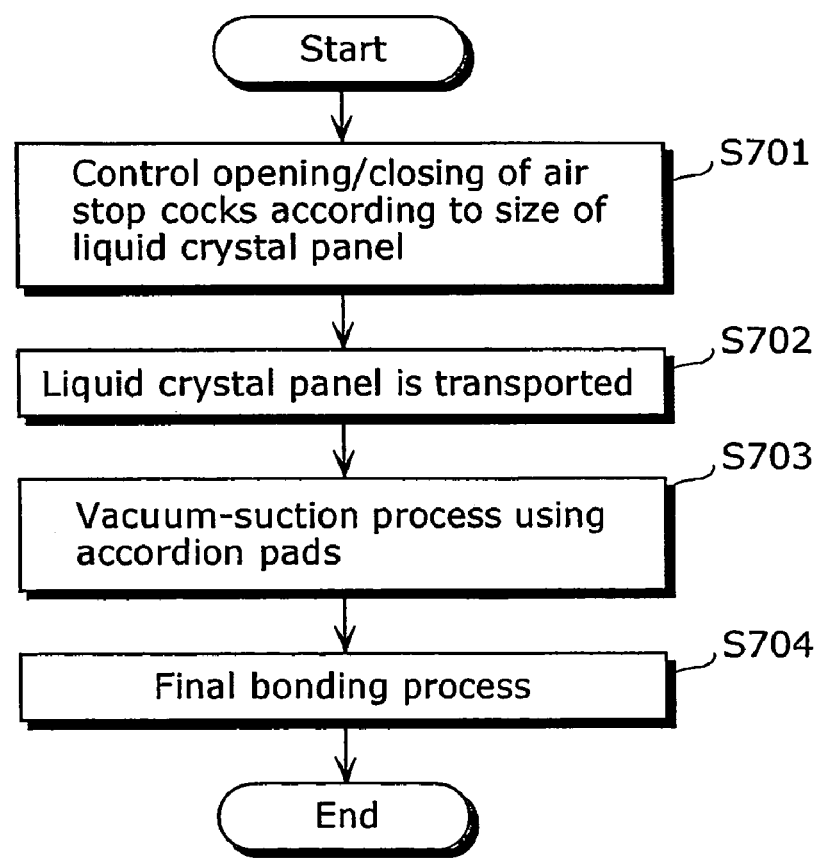

Gate side

Source side

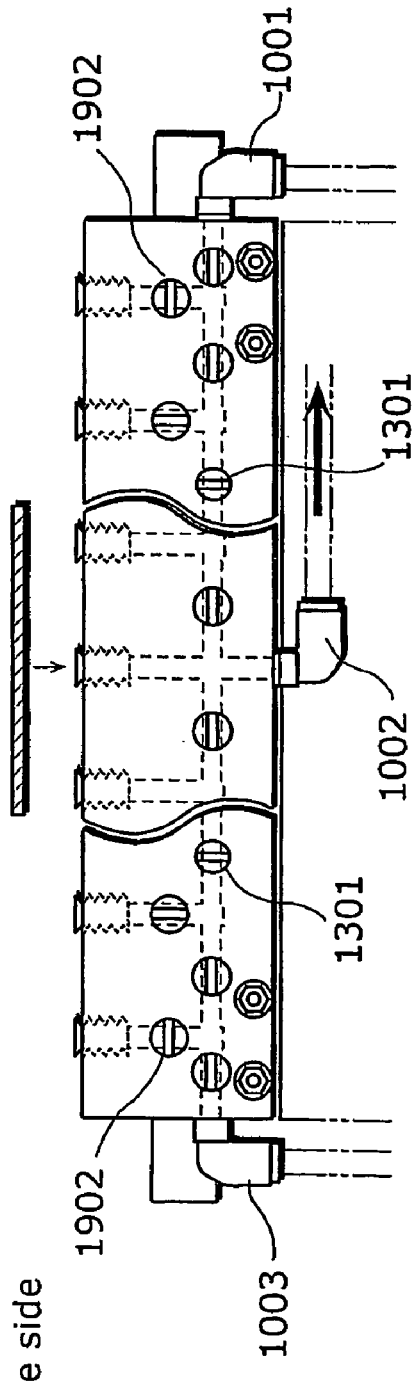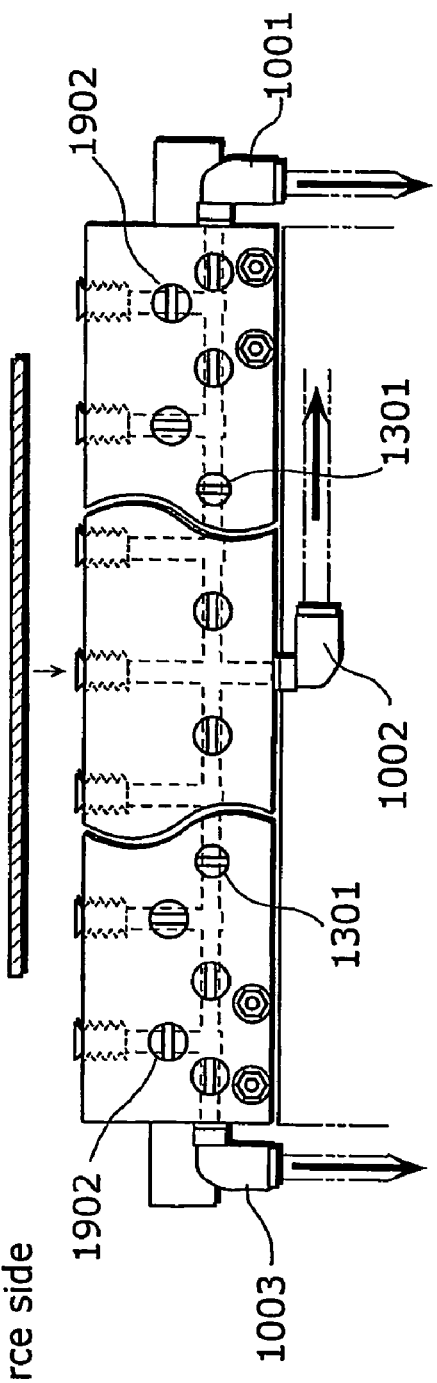
FIG. 19A Gate side
FIG. 19B Source side

SUBSTRATE PROCESSING APPARATUS AND MOUNTER

TECHNICAL FIELD

The present invention relates to a substrate processing apparatus and a mounter for use in a process of mounting electronic components such as integrated circuits (ICs) onto the outer edge portion of a liquid crystal panel or the like, and particularly to a substrate processing apparatus and a mounter for performing processing at the time of mounting components onto a large liquid crystal panel.

BACKGROUND ART

Recent years have seen an increasing demand for large liquid crystal panels such as large liquid crystal televisions, and liquid crystal panels ranging in size from small to large are produced.

Conventionally, in the anisotropic conductive film (ACF) bonding process, pre-bonding process, final bonding process, or the like of a liquid crystal driver mounter that bonds semiconductor components to the outer edge portion of a liquid crystal panel, a backup stage equipped to such liquid crystal driver mounter is used. The processes of bonding an ACF tape and placing electronic components are performed by placing the outer edge portion of the liquid crystal panel on such backup stage.

Meanwhile, as a technology to improve the accuracy of placing electronic components onto the outer edge portion of a liquid crystal panel, there is disclosed a mounter for a liquid crystal panel that is capable of smoothly bonding components under application of pressure despite a level difference between a sucking and supporting surface and a portion onto which components are placed, while appropriately maintaining such a level difference (for example, refer to Japanese Laid-Open Patent application No. 05-228755).

However, since a relatively large liquid crystal panel, which has been growing in demand in recent years, has long sides, there is a problem that such large liquid crystal panel is more susceptible to warping and bending at the outer edge portion onto which semiconductor components are mounted, compared with a small liquid crystal panel, and that the accuracy of placing electronic components in each bonding process of component mounting is decreased. For example, there is a problem that, due to warping at its outer edge portion onto which components are placed, a liquid crystal panel partially rises from the backup causing displacement of semiconductor components, defective bonding, damages in a liquid crystal panel glass, and the like when pressure is applied by a pressure tool.

Furthermore, it is desired to reduce the occurrence of defective bonding of electronic components in a liquid crystal mounter since the price of liquid crystal panels increases as their sizes become larger.

The present invention has been conceived in view of the above circumstances, and it is an object of the present invention to provide a mounter that places electronic components with higher accuracy even in the case of performing component mounting and the like for a large liquid crystal panel.

A second object of the present invention is to provide a substrate processing apparatus that improves the accuracy of processing a substrate by performing, in each process of component mounting or the like for a substrate such as a large liquid crystal panel, warping correction of the outer edge portion by performing the suction process appropriate for the size of each liquid crystal panel.

DISCLOSURE OF INVENTION

In order to solve the above problems, the substrate processing apparatus according to the present invention is a substrate processing apparatus for use in a process of mounting electronic components onto an outer edge portion of a substrate, the apparatus including: a suction stage including (i) suction portions for sucking an undersurface of the outer edge portion of the substrate, and (ii) a flat portion for correcting warping at the undersurface of the outer edge portion of the substrate; vacuum paths connected to the suction stage; and a vacuum-suction unit that vacuum-sucks the outer edge portion of the substrate to be placed on the suction stage using the suction portions, the vacuum-suction unit being connected to at least one of the vacuum paths.

Furthermore, the substrate processing apparatus according to the present invention is characterized in that a hollow portion for connecting the vacuum paths and the suction portions is formed inside the suction stage.

Moreover, the substrate processing apparatus according to the present invention is characterized in that its hollow portion is made up of the following hollow portions formed inside the suction stage: a first hollow portion that is formed horizontally traversing the suction stage; and second hollow portions that are formed vertically to the suction stage to connect the first hollow portion and the suction portions, and the opening and closing unit is made up of: first stop cocks equipped on the first hollow portion at predetermined intervals; and second stop cocks equipped on the respective second hollow portions.

Furthermore, the substrate processing apparatus according to the present invention is characterized in that its vacuum paths include the following vacuum paths connected to the hollow portion: a first vacuum path that is located in a central portion of the suction stage in the longitudinal direction; and second vacuum paths, one of which is located at a right end portion of the suction stage and the other of which is located at a left end portion of the suction stage, and the substrate processing apparatus further includes a vacuum path determination unit that determines a vacuum path to be used from the first vacuum path and second vacuum paths depending on whether processing is performed on a short side or a long side of the substrate.

With the above structure, since plural hollow portions connected to the suction portions are formed inside the suction stage, it is possible to change a suction area according to the size of a substrate by closing or opening the hollow portions by the opening and closing unit.

Furthermore, it is possible to change a vacuum path to be used according to a determination made by the vacuum path determination unit depending on whether processing is performed on a long side or a short side of the substrate such as a liquid crystal panel.

As is obvious from the above, it is possible to improve the accuracy of placing electronic components onto a liquid crystal panel of various sizes, ranging from large to small, by correcting warping by appropriately sucking its outer edge portion to reliably prevent the leakage of air.

Also, the mounter according to the present invention is a mounter that mounts electronic components onto a liquid crystal panel, the mounter including: a pressure head that pressurizes the electronic components to an outer edge portion of the liquid crystal panel; a backup stage that is a placement stage for supporting, from the back, the outer edge portion of the liquid crystal panel when the pressure head pressurizes the electronic components; a suction stage that is equipped close to and in parallel with the backup stage, and that includes suction portions for sucking the outer edge portion of the liquid crystal panel; vacuum paths that are connected to the suction stage; and a vacuum-suction unit that vacuum-sucks the liquid crystal panel to be placed on the suction stage, the vacuum-suction unit being connected to the suction stage via at least one of the vacuum paths.

Furthermore, the mounter according to the present invention is characterized in that a hollow portion for connecting the vacuum paths and the suction portions is formed inside the suction stage.

Moreover, the mounter according to the present invention is characterized in that its suction portions are suction pads which are flexible in an up and down direction, the suction pads being equipped at predetermined intervals along a longitudinal direction of the suction stage in a manner that the suction pads penetrate a top surface of the suction stage.

Furthermore, the mounter according to the present invention is characterized in that it further includes an opening and closing unit that opens and closes the hollow portion.

With the above structure, a liquid crystal panel is placed onto the suction stage that is located close to and in parallel with the backup stage, and by sucking such liquid crystal panel using suction portions equipped to the suction stage, it is possible to maintain the flatness of the outer edge portion of the liquid crystal panel along the suction stage. Accordingly, it is possible to perform mounting of electronic components while maintaining the flatness of a liquid crystal panel even when a large liquid crystal panel is used by the mounter.

Furthermore, since it is possible to adjust, through the opening and closing unit, the size of an area including suction portions used for performing suction using the vacuum-suction unit, suction is performed according to the size of a liquid crystal panel, and the leakage of air used for suction is reliably prevented.

It should be noted that, in order to achieve the above objects, the present invention may be embodied as the following: a substrate processing method that includes, as its steps, the characteristic constituent elements of the above substrate processing apparatus; a warping correction unit that is the suction stage per se of the substrate processing apparatus; a mounting method that includes, as its steps, the characteristic constituent elements of the mounter; and a liquid crystal driver mounter that is equipped with the above mounter.

The substrate processing apparatus according to the present invention is capable of improving the accuracy of the mounting process by correcting warping of each liquid crystal panel by appropriately performing the suction process according to the sizes of the short sides and long sides of liquid crystal panels that range in size from small to large in processes for mounting electronic components onto each large liquid crystal panel such as processes of terminal cleaning, component mounting, and lead checking.

What is more, the mounter according to the present invention is capable of improving the accuracy of placing components at the time of component mounting by maintaining the flatness of the outer edge portion of a liquid crystal panel even in the case where electronic components are mounted onto a large liquid crystal panel.

The disclosures of Japanese Patent Application No. 2004-202386 filed on Jul. 8, 2004 and Japanese Patent Application No. 2004-241110 filed on Aug. 20, 2004 including specification, drawings and claims are incorporated herein by reference in its entirety.

BRIEF DESCRIPTION OF DRAWINGS

These and other objects, advantages and features of the invention will become apparent from the following description thereof taken in conjunction with the accompanying drawings that illustrate a specific embodiment of the invention. In the Drawings:

FIG. 7 is flowchart showing an operating procedure taken by the mounter of the present invention to correct warping of a liquid crystal panel;

FIG. 19A and FIG. 19B are side views showing a warping correction unit of the substrate processing apparatus according to the third embodiment;

DETAILED DESCRIPTION OF THE INVENTION

The following describes a mounter according to the present invention with reference to the drawings.

First Embodiment

Figure 1A:
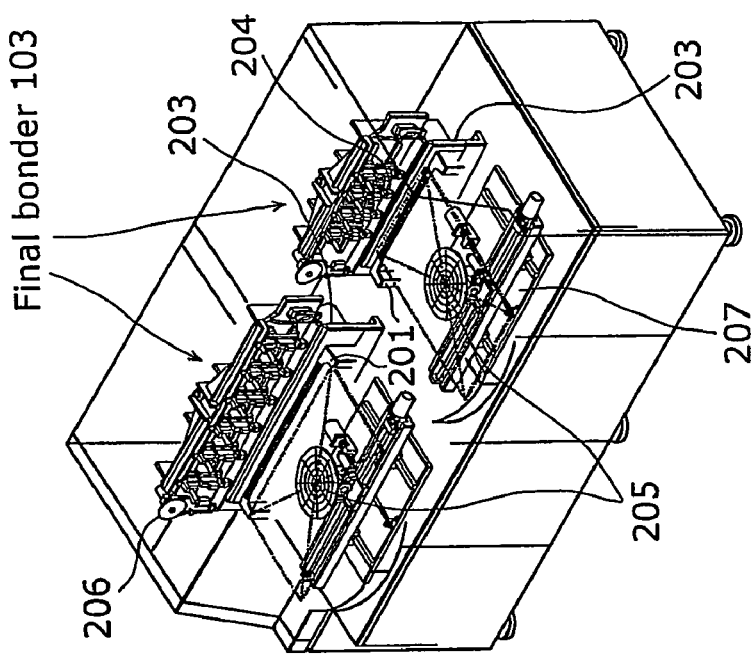
FIG. 1A and FIG. 1B are overall views showing a liquid crystal driver mounter according to a first embodiment.
Figure 1B:
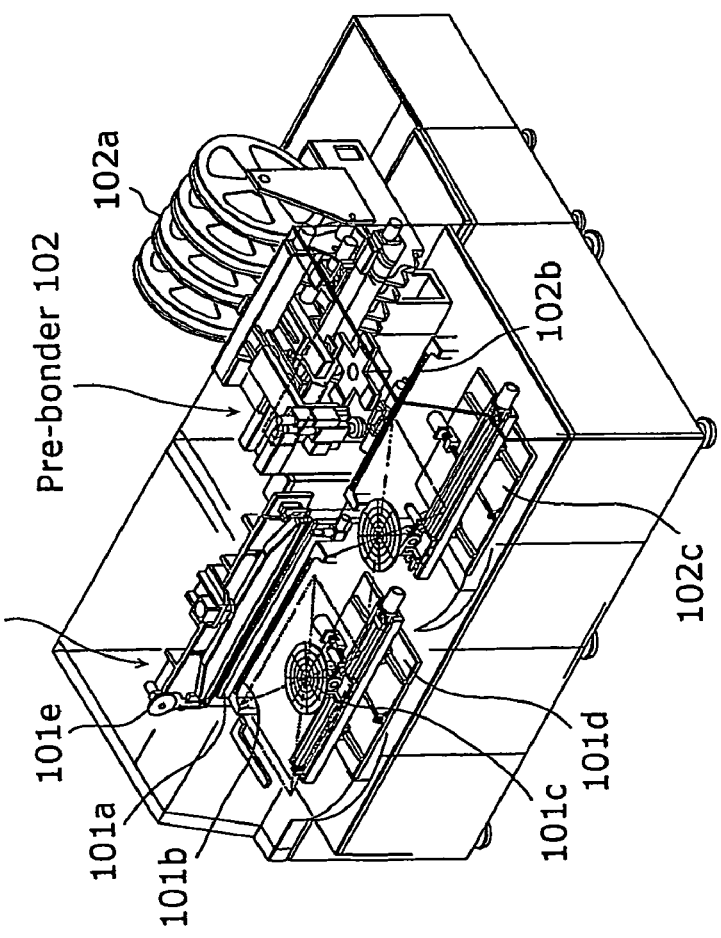

FIG. 1A and FIG. 1B are overall views showing a liquid crystal driver mounter according to the first embodiment.

The processes performed by the liquid crystal driver mounter used in a line is equipped with: an anisotropic conductive film (ACF) bonding process 101, which is the first process and is shown in FIG. 1A, of bonding an ACF tape onto a liquid crystal panel; a pre-bonding process 102, which is the second process and is shown in FIG. 1A, of carrying out the pre-bonding of electronic components such as semiconductor components to the liquid crystal panel; and a final bonding process 103, which is the third process and is shown in FIG. 1B, of carrying out the final bonding of the semiconductor components onto the liquid crystal panel.

The ACF bonding process is performed by an ACF bonder 101 that is equipped with a backup stage 101a, a warping correction unit 101b, a panel stage 101c, an XY table 101d, and an ACF supply unit 101e, or the like.

First, when a liquid crystal panel is transported to the ACF bonder 101, an anisotropic conductive film tape (hereinafter described as "ACF film tape") is bonded to the liquid crystal panel on the backup stage 101a, using an ACF bonding head. The ACF tape, which is an adhesive tape including electrically conductive particles sized about 3 μm, is intended for electrically connecting an electrode of a semiconductor component and an electrode of a liquid crystal panel via such electrically conductive particles, when the semiconductor component is pressed against the liquid crystal panel, in a state that such ACF film tape is in between the liquid crystal panel and such semiconductor component. Thus, the use of an ACF film tape provides electric conductivity between a driver IC and a liquid crystal panel.

Furthermore, as shown in FIG. 1A, since the ACF bonder 101 is equipped with the warping correction unit 101b in the present embodiment, it is possible to correct warping at the outer edge portion of a liquid crystal panel at the time of component mounting even when such liquid crystal panel is a large liquid crystal panel.

The types of liquid crystal panels include, for example: glass substrate such as liquid crystal display substrate (LCD substrate) and plasma display panel substrate (PDP substrate); and substrate including flexible printed circuit substrate (FPC substrate). Meanwhile, the types of semiconductor components include IC chip, and a variety of semiconductor devices, and the like.

The panel stage 101c vacuum-sucks a liquid crystal panel and holds it, as well as rotating and moving a liquid crystal panel to determine a placement position of such liquid crystal panel. The XY table 101d determines a placement position of the liquid crystal panel such that the periphery of the outer edge portion of such liquid crystal panel is placed on the backup stage 101a and the warping correction unit 101b.

Then, the liquid crystal panel is transported to the prebonder 102 which is equipped with a component supply unit 102a, a backup stage 102b, and an XY table 102c, or the like.

In the pre-bonding process, semiconductor components supplied from the component supply unit 102a using a tape carrier package (TCP) tape or the like are aligned on the outer edge portion of a liquid crystal panel on the backup stage 102b, and then placed onto an ACF film tape which has been bonded to the liquid crystal panel.

The pre-bonder 102 is equipped with the component supply unit 102a that obtains semiconductor components to be placed on the outer edge portion of a liquid crystal panel via a tray or a TCP tape (semiconductor components are cut out from the tape, using a mold).

Next, the final bonding process of carrying out the final bonding of the semiconductor components to the liquid crystal panel is performed. The final-bonder 103 shown in FIG. 1B is equipped with a warping correction unit 201, a backup stage 203, a pressure head 204, panel stages 205, a sheet supply unit 206, and an XY stage 207, or the like.

The final-bonder 103 carries out the final bonding, to the outer edge portion of the liquid crystal panel, of the semiconductor components that have been pre-bonded by being applied with heat and pressure, using the pressure head 204 intended for pressing electronic components using the backup stage 203. Furthermore, since the present invention includes the warping correction unit 201, it is possible to carry out the final bonding process while maintaining the flatness of a large liquid crystal panel by correcting warping at its outer edge portion.

The panel stages 205, together with the XY stage 207, transport the liquid crystal panel by rotating and moving it in a predetermined direction while vacuum-sucking such liquid crystal panel, and determine a placement position of the liquid crystal panel.

In the final bonding process, there are equipped two finalbonders 103, one in the vertical direction of a liquid crystal panel and the other in the horizontal direction of the liquid crystal panel, for example. Note that pressure methods that may be employed in the final bonding process include: a collective pressure method that uses a pressure head unit for applying pressure to electronic components on a collective basis; and an individual pressure method that uses the pressure head 204 for applying pressure to electronic components on an individual basis. The ACF bonder 101, the pre-bonder 102, and the final-bonder 103 are operated using an operating panel serving as a controller.

Also note that although the warping correction unit 201 equipped to the mounter of the present invention is used by the ACF bonder 101 and the final-bonder 103 in FIG. 1A and FIG. 1B, it may be used also by the pre-bonder 102. The warping correction unit of the present invention is effective for use in processes in which high placement accuracy is particularly required, such as the pre-bonding process and the final bonding process.

Figure 2:
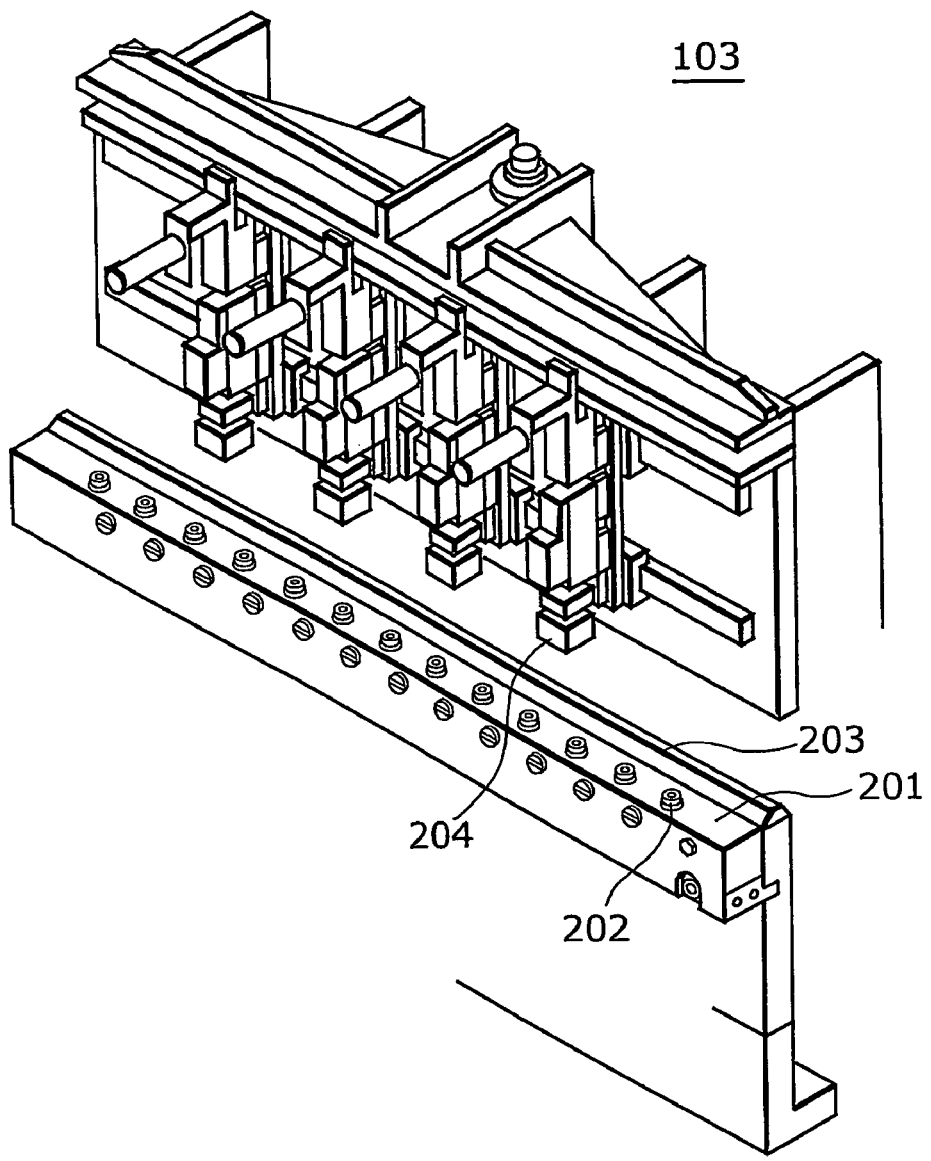
FIG. 2 is an enlarged perspective view showing the mounter in the final bonding process shown in FIG. 1B.

FIG. 2 is an enlarged perspective view showing the mounter 103 in the final bonding process shown in FIG. 1B.

The mounter 103 is equipped with the warping correction unit 201, the backup stage 203, and the pressure head 204, or the like. Plural accordion pads 202 are equipped on the warping correction unit 201 for sucking a liquid crystal panel. This warping correction unit 201 is equipped in parallel with the backup stage 203 with a distance of about 20 mm between them, and has the same longitudinal length as that of the backup stage 203.

The periphery of the outer edge portion of a liquid crystal panel is placed onto the warping correction unit 201, and by sucking the liquid crystal panel using the accordion pads 202, it becomes possible to maintain the flatness of the outer edge portion of the liquid crystal panel. Note that in FIG. 2, the warping correction unit 201 is fixedly attached to the backup stage 203.

The backup stage 203 is a stage for supporting, from the back, the outer edge portion of the liquid crystal panel when pressure is applied to it in the bonding of semiconductor component. The pressure head 204 carries out the final bonding of the semiconductor components to the outer edge portion of the liquid crystal panel by applying pressure and heat to them. Note that in FIG. 2, the pressure head 204 employs the individual pressure method for applying pressure to semiconductor components on an individual basis.

Figure 3A:
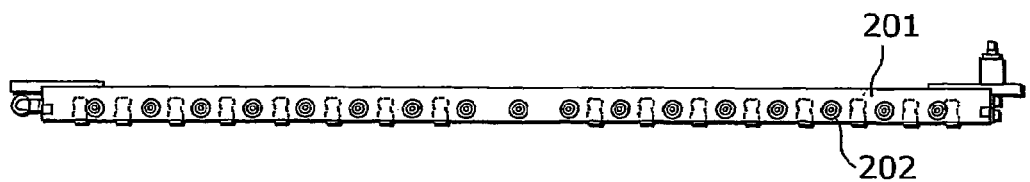
FIG. 3A and FIG. 3B are a top view and a side view, respectively, showing a warping correction unit of the mounter according to the present invention.
Figure 3B:
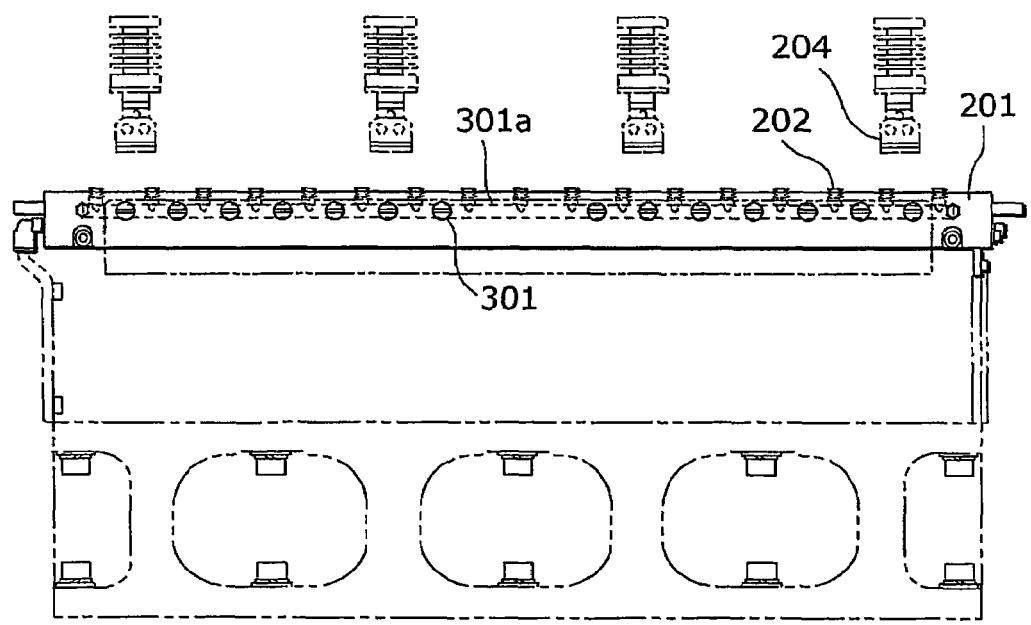

FIG. 3A and FIG. 3B are a top view and a side view, respectively, showing the warping correction unit 201 of the mounter 103 according to the present invention.

Referring to FIG. 3A, which is a top view of the warping correction unit 201, the accordion pads 202 serving as suction portions are equipped in the longitudinal direction at predetermined intervals of about 30 mm. In order to perform vacuum suction, the accordion pads 202 are connected to a vacuum-suction unit via inside holes 301a that are provided inside the warping correction unit 201.

Referring to FIG. 3B, which is a side view of the warping correction unit 201, the top surface of each accordion pad 202 is designed to be about 2.5 mm higher, for example, than the top surface of the warping correction unit 201 before a liquid crystal panel is placed on the warping correction unit 201. This structure makes it possible to correct warping of a liquid crystal panel by allowing the accordion pads 202 to vacuum-suck the outer edge portion of a liquid crystal panel to be placed on the warping correction unit 201 in a manner that the accordion pads 202 are reliably in contact with such liquid crystal panel according to the shape of its outer edge portion. The accordion pads 202 here are commercially available accordion pads made of rubber, and the diameter of the accordion pads 202 is, for example, about 10 mm.

In order to adjust the size of a vacuum suction area, an air stop cock 301 for controlling the size of an area including inside holes 301a to be used is provided between each accordion pad 202. By changing the size of an area including accordion pads 202 to be used for vacuum suction by opening or closing air stop cocks 301 depending on the size of a liquid crystal panel, it becomes possible to reliably prevent the leakage of air from accordion pads 202 at the time of suction.

Figure 4:
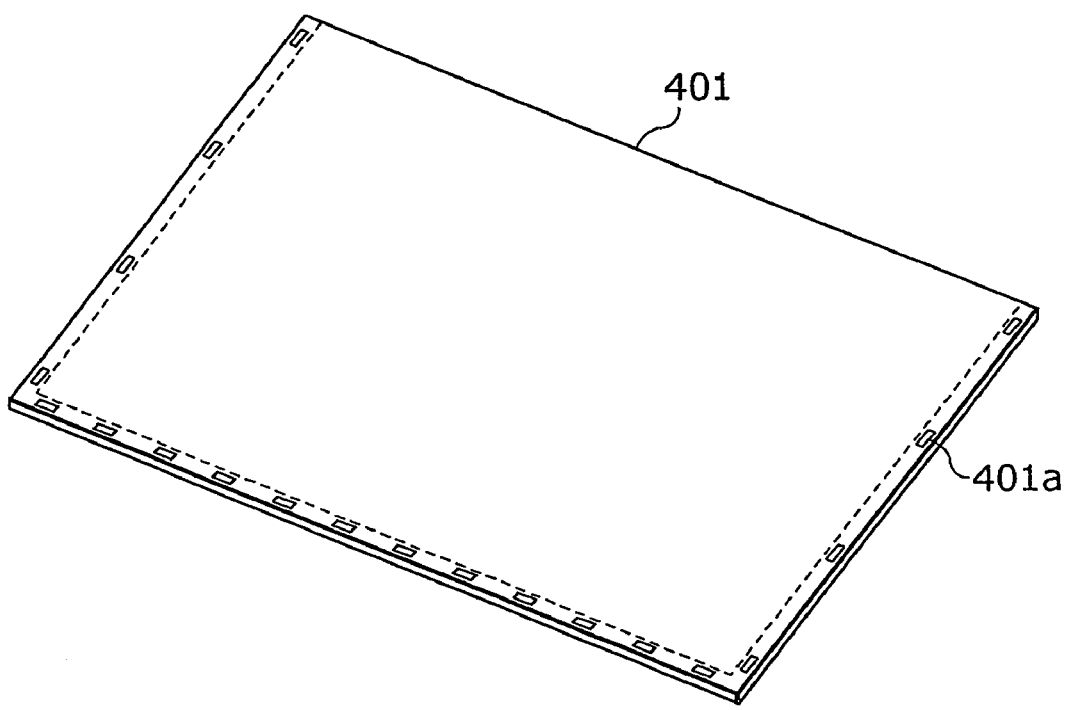
FIG. 4 is an external view showing a large liquid crystal panel onto which components are mounted by the mounter.

FIG. 4 is an external view showing a large liquid crystal panel 401 onto which components are mounted by the mounter. Here, a "large liquid crystal panel" refers to, for example, a 20-inch panel or larger such as a 34-inch panel (773 mm by 433 mm) and a 25-inch panel (573 mm by 321 mm). Meanwhile, a "small liquid crystal panel" refers to, for example, a panel smaller than a 20-inch panel such as a 15-inch panel (315 mm by 239 mm).

Figure 5:
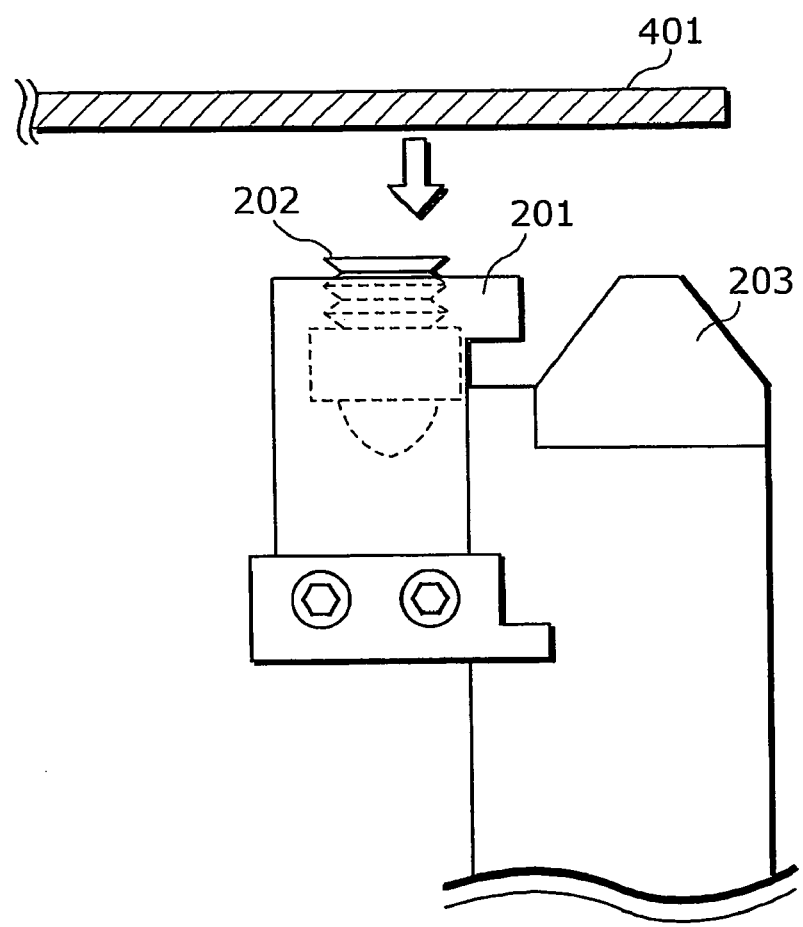
FIG. 5 is an enlarged cross-sectional view showing the mounter shown in FIG. 3A and FIG. 3B according to the present invention.

FIG. 5 is an enlarged cross-sectional view showing the mounter 103 shown in FIG. 3A and FIG. 3B according to the present invention.

As shown in FIG. 5, the outer edge portion of the liquid crystal panel 401 is first moved up above the backup stage 203, and then moved down in the direction pointed by the arrow to be placed on the warping correction unit 201 and the backup stage 203. As a result, the outer edge portion of the liquid crystal panel 401 is placed on the accordion pads 202 that are equipped in a manner that their top surfaces are higher than the top surface of the warping correction unit 201.

Figure 6A:
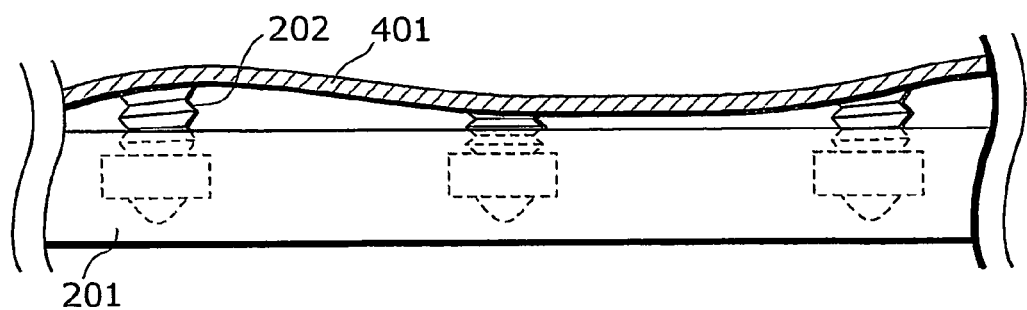
FIG. 6A and FIG. 6B are diagrams illustrating how warping of a liquid crystal panel is corrected in the warping correction unit of the mounter according to the first embodiment.
Figure 6B:
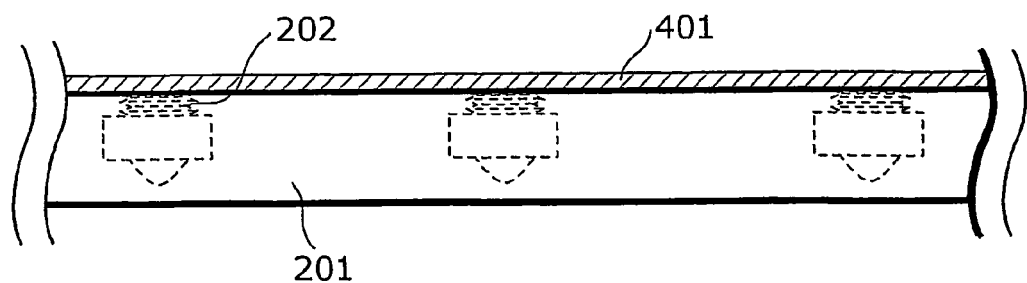

FIG. 6A and FIG. 6B are diagrams illustrating how warping of the liquid crystal panel 401 is corrected in the warping correction unit 201 of the mounter according to the present embodiment.

Referring to FIG. 6A, which is a side view showing the liquid crystal panel 401 before warping at its outer edge portion is corrected, the liquid crystal panel 401 is placed onto the accordion pads 202. Since such large liquid crystal panel 401 is made of plural glasses that are laminated over one another, the center of the liquid crystal panel 401 in the longitudinal direction is bended and its outer edge portion is in a wavy form as shown in FIG. 6A.

Referring to FIG. 6B, which is a side view showing the liquid crystal panel 401 after the warping at its outer edge portion is corrected, it is possible to reliably correct the warping of the liquid crystal panel 401 and to maintain the flatness of its outer edge portion by vacuum-sucking the liquid crystal panel 401 using the accordion pads 202.

FIG. 7 is flowchart showing the operating procedure taken by the mounter 103 of the present invention to correct warping of the liquid crystal panel 401.

First, adjustment is made to the size of an area, on the warping correction unit 201, including accordion pads 202 to be used for vacuum suction, according to the size of the liquid crystal panel 401 onto which liquid crystals are to be mounted (S701).

Next, the liquid crystal panel 401 is transported using the XY table 207 and the panel stages 205 in a manner that the outer edge portion of the liquid crystal panel 401 is placed onto the warping correction unit 201 and the backup stage 203 (S702).

Then, using the accordion pads 202 equipped to the warping correction unit 201, the outer edge portion of the liquid crystal panel 401 is sucked so as to correct the warping (S703).

Finally, after the warping is corrected, the final bonding of the electronic components onto the liquid crystal panel 401 is carried out (S704).

As described above, the mounter according to the present embodiment is equipped with the warping correction unit 201 equipped in parallel with the backup stage 203 at which the final bonding of components to the liquid crystal panel 401 is carried out. What is more, by sucking the outer edge portion of the liquid crystal panel 401 using accordion pads 202 equipped to the warping correction unit 201, it becomes possible to maintain the flatness of the outer edge portion of a large liquid crystal panel 401 that is particularly subjected to warping and bending, and thus to improve the accuracy of placing electronic components in the final bonding process and pre-bonding process.

Furthermore, since the accordion pads 202 are equipped in a manner that their top surfaces are higher than the top surface of the warping correction unit 201, it is possible to reliably trap and suck the outer edge portion of the liquid crystal panel 401 placed on the warping correction unit 201.

Moreover, it is possible to prevent the leakage of air by opening and closing air stop cocks 301 according to the size of a liquid crystal panel 401.

(Variation)

Next, a description is given of a variation of using the warping correction unit in the mounter according to the present invention.

Figure 8:
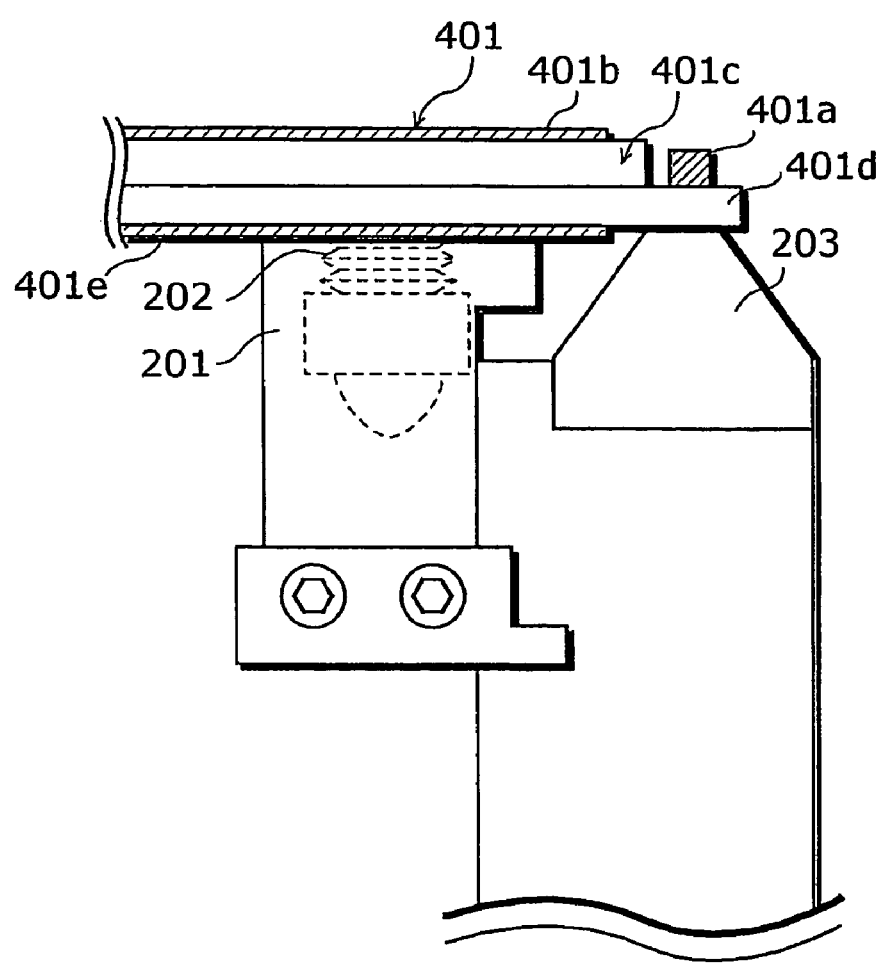
FIG. 8 is an enlarged cross-sectional view showing a liquid crystal panel onto which semiconductor components are mounted by the mounter according to a variation of the first embodiment.

FIG. 8 is an enlarged cross-sectional view showing a liquid crystal panel onto which semiconductor components are mounted by the mounter 103 according to the present variation.

As shown in FIG. 8, the liquid crystal panel 401 is made up of a laminated glass composed of two substrates such as an array substrate 401d and a color filter substrate 401c, and a deflecting plate 401e and a protection film 401b applied on the surfaces of the laminated glass.

A semiconductor component 401a is placed on the outer edge portion of the array substrate 401d of the liquid crystal panel 401. This generates a level difference that is equivalent in thickness to the thickness of the deflecting plate 401e between the top surface of the backup stage 203 and the top surface of the warping correction unit 201. Note that thickness tolerance of the deflecting plate 401e differs greatly depending on liquid crystal panels 401 and the thickness of liquid crystal panels 401 varies depending on their types.

Thus, by giving a difference in height that is equivalent to the level difference equivalent to the thickness of the deflecting plate 401e between the top surface of the backup stage 203 and the top surface of the warping correction unit 201 that supports the liquid crystal panel 401 through suction, it becomes possible to prevent the liquid crystal panel 401 from partially rising and being displaced from the warping correction unit 201 owing to the thickness of the deflecting plate 401e in the bonding process of semiconductor components. Furthermore, it is also conceivable to suck the liquid crystal panel 401 using a spring whose suction power is weaker than that of an accordion pad 202.

Therefore, according to the mounter of the present variation, it is possible to improve the accuracy of placing semiconductor components since the final bonding process is performed in consideration of the thickness of the deflecting plate 401e in the warping correction unit 201.

Figure 9:
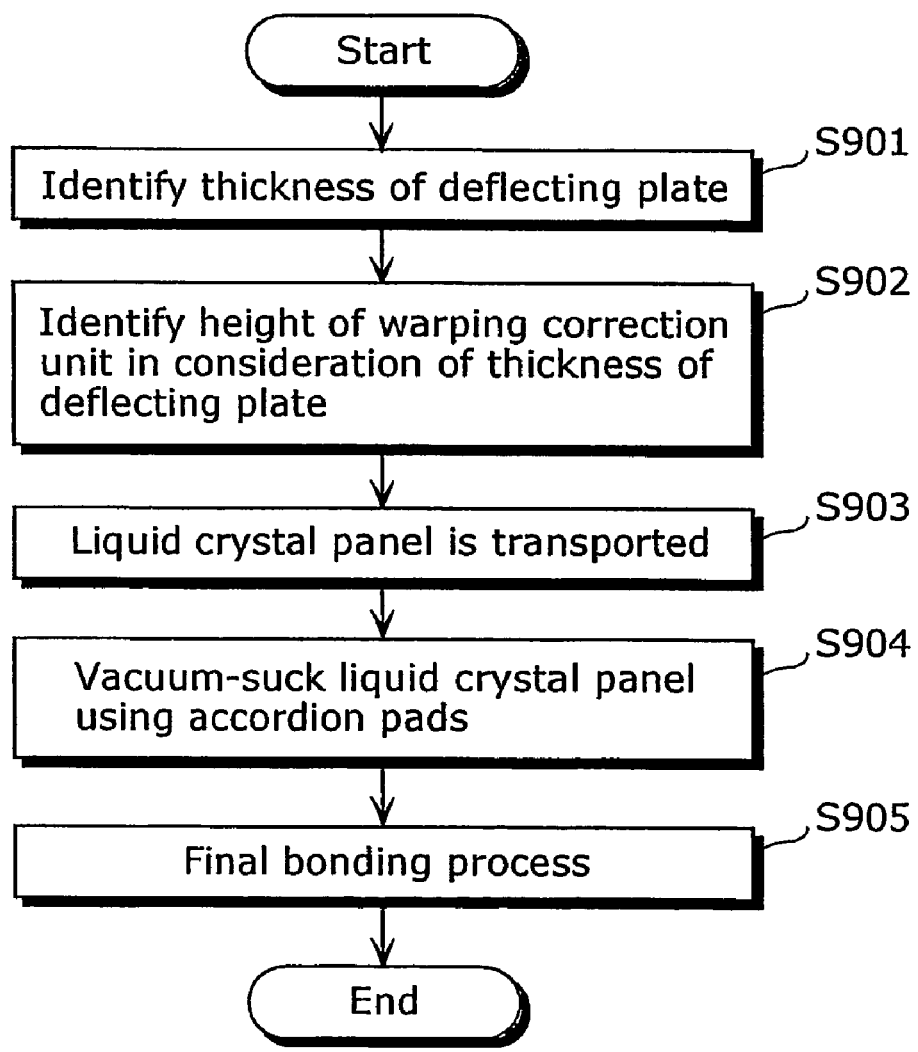
FIG. 9 is a flowchart showing an operating procedure for adjusting the thickness of a deflecting plate in the warping correction unit of the mounter according to the variation.

FIG. 9 is a flowchart showing the operating procedure for adjusting the thickness of the deflecting plate 401e in the warping correction unit 201 of the mounter 103 according to the present variation.

First, the thickness of the deflecting plate 401e of the liquid crystal panel 401 is identified (S901), and then the height of the warping correction unit 201 is identified and adjusted in consideration of the thickness of such deflecting plate 401e (S902). Then, the liquid crystal panel 401 is transported to be placed onto the accordion pads 202 (S903), and such liquid crystal panel 401 is vacuum-sucked using the accordion pads 202 (S904). After this, the final bonding of semiconductor components is carried out using the pressure head 204 (S905).

As described above, according to the present variation, the placement accuracy is improved since it is possible to adjust the height of the warping correction unit 201 in consideration of the thickness of the deflecting plate 401e that constitutes a liquid crystal panel 401 and to automatically adapt to the level difference that varies depending on liquid crystal panel 401.

Note that the present embodiment has been described on the assumption that the warping correction unit 201 is used for the mounter, but the use of the warping correction unit 201 is not limited to this. It is therefore possible to use the warping correction unit 201, for example, for a terminal cleaner that is used before mounting ICs onto a liquid crystal panel and for a lead checker that is used after the mounting of ICs. It should be also noted that the warping correction unit 201 can be used for the mounting processing of not only a large liquid crystal panel but also a small liquid crystal panel.

Second Embodiment

Figure 10:
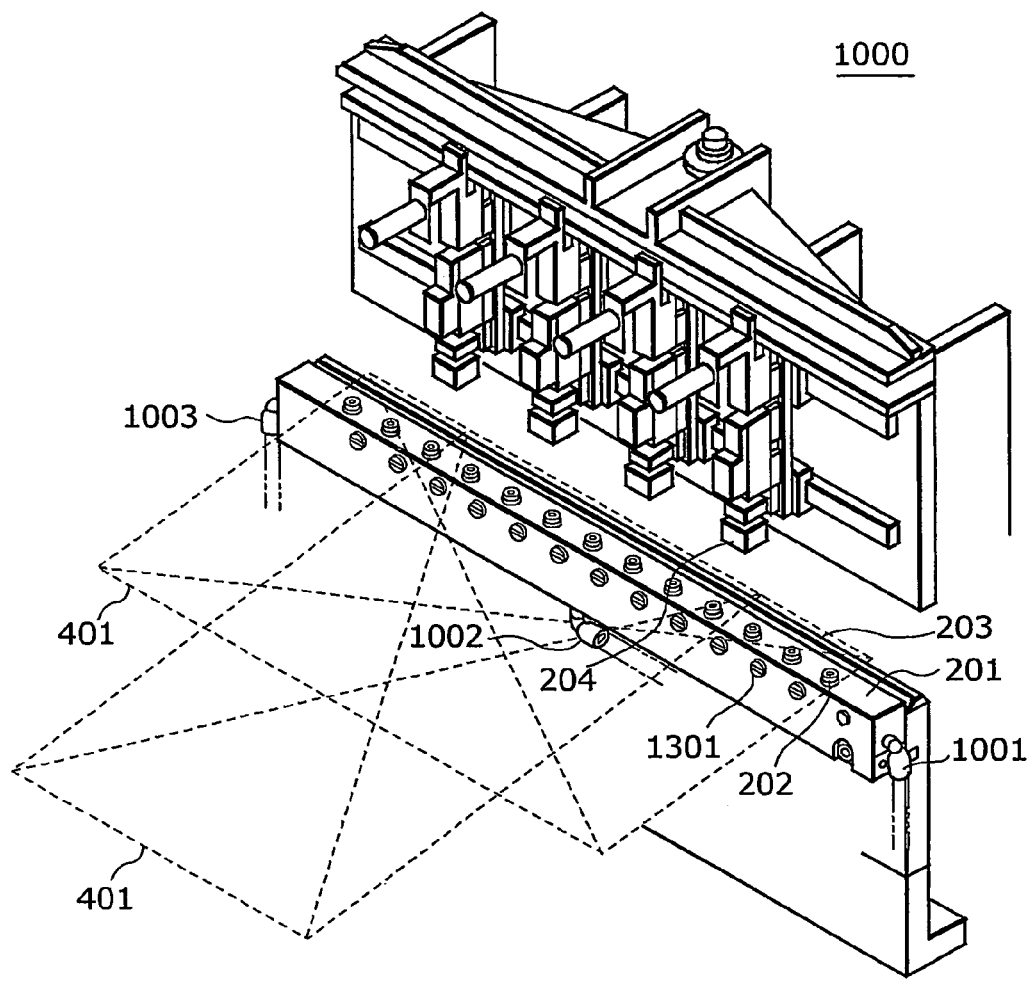
FIG. 10 is an enlarged perspective view showing a substrate processing apparatus according to the present invention.

FIG. 10 is an enlarged perspective view showing a substrate processing apparatus 1000 according to the present invention.

Note that in the second embodiment, the substrate processing apparatus 1000 is described using the drawings of the mounter 103, as described in the first embodiment, that carries out the final bonding of semiconductor components onto a liquid crystal panel, but the substrate processing apparatus 1000 may be a terminal cleaner that cleans the outer edge portion of a liquid crystal panel prior to the process of mounting ICs onto the liquid crystal panel and may be a lead checker that inspects the lead position of a tape automated bonding (TAB) after the mounting of ICs, and the like. Also note that the substrate processing apparatus 1000 according to the present invention is particularly intended for processing the long sides and the short sides of a large liquid crystal panel by the same single apparatus. Furthermore, the second embodiment is directed to the case where the length of the source sides, being the long sides of a liquid crystal panel, is the same as the length of a suction area of the warping correction unit.

The substrate processing apparatus 1000 in the final bonding process shown in FIG. 10 is equipped with a warping correction unit 201, a backup stage 203, a pressure head 204, and an air stop cock 1301, or the like.

This substrate processing apparatus 1000 carries out the final bonding, to the outer edge portion of a liquid crystal panel, of semiconductor components that have been pre-bonded by being applied with heat and pressure, using the pressure head 204 intended for pressing electronic components using the backup stage 203. Furthermore, since the warping correction unit 201 is included, it is possible to carry out the final bonding process while maintaining the flatness of a large liquid crystal panel by correcting warping at its outer edge portion.

Furthermore, the substrate processing apparatus 1000 rotates and moves the liquid crystal panel on the panel stage while sucking such liquid crystal panel, so that the liquid crystal panel in both the longitudinal and lateral directions is processed by the same single apparatus.

The warping correction unit 201 is equipped in parallel with the backup stage 203 with a distance of about 20 mm between them, and has the same longitudinal length as that of the backup stage 203. The warping correction unit 201 is equipped with plural accordion pads 202 for sucking a liquid crystal panel. These accordion pads 202 are equipped in the longitudinal direction at predetermined intervals of about 30 mm. In order to perform vacuum suction, the accordion pads 202 are connected to a vacuum-suction unit serving as a vacuum source via a hollow portion (to be described in detail later in FIG. 12A and FIG. 12B) provided inside the warping correction unit 201.

Furthermore, by placing, on the backup stage 203 and the warping correction unit 201, the outer edge portion corresponding to the source side and the gate sides of the liquid crystal panel 401, and by sucking it by accordion pads 202, it is possible to maintain the flatness of the outer edge portion of the liquid crystal panel.

The backup stage 203 is a stage for supporting, from the back, the outer edge portion of the liquid crystal panel when pressure is applied to it in the bonding of semiconductor component. The pressure head 204 carries out the final bonding of the semiconductor components to the outer edge portion of the liquid crystal panel by applying pressure and heat to them. Note that in FIG. 10, the pressure head 204 employs the individual pressure method for applying pressure to semiconductor components on an individual basis.

Moreover, in the present invention, vacuum paths 1001, 1002, and 1003 are formed at three positions in the warping correction unit 201: the lower central portion, the right end portion, and the left end portion of the warping correction unit

201. Furthermore, the substrate processing apparatus 1000 is equipped with a controller serving as a vacuum path determination unit that determines vacuum path(s) to be used from among the plural vacuum paths 1001, 1002, and 1003 based on substrate data. Thus, by the controller selecting vacuum path(s) to be used from among these vacuum paths 1001, 1002, and 1003 for the long side and short sides of the liquid crystal panel 401, respectively, it is possible to appropriately determine a suction area of the suction pads equipped to the warping correction 201.

Note that in FIG. 10, the warping correction unit 201 is fixed to the backup stage 203, but it is possible to easily exchange warping correction unit 201 by fixing the warping correction unit 201 at its left and right sides using blocks.

Figure 11:
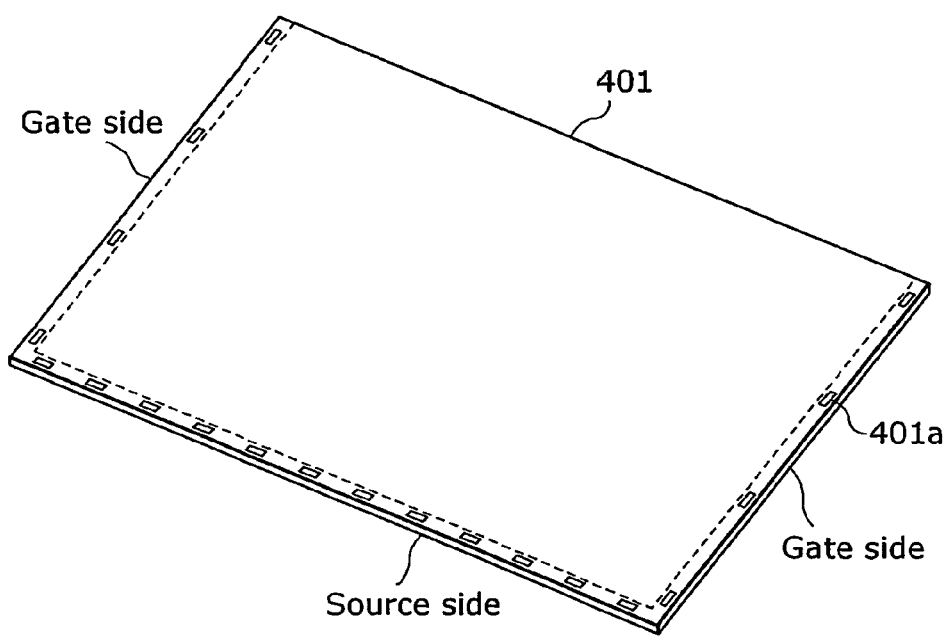
FIG. 11 is an external view showing a large liquid crystal panel onto which components are mounted by the substrate processing apparatus.

FIG. 11 is an external view showing a large liquid crystal panel 401 onto which components are mounted by the substrate processing apparatus 1000. Here, a "large liquid crystal panel" refers to, for example, a 20-inch panel or larger such as a 34-inch panel (773 mm by 433 mm) and a 25-inch panel (573 mm by 321 mm). Meanwhile, a "small liquid crystal panel" refers to, for example, a panel smaller than a 20-inch panel such as a 15-inch panel (315 mm by 239 mm).

The types of liquid crystal panels include, for example: glass substrate such as liquid crystal display substrate (LCD substrate) and plasma display panel substrate (PDP substrate); and substrate including flexible printed circuit substrate (FPC substrate). Meanwhile, the types of semiconductor components 401a include IC chip, and a variety of semiconductor devices, and the like.

Note that FIG. 11 illustrates the liquid crystal panel to which electronic components are mounted on its three sides, but electronic components are mounted on two sides, a long side and a short side, for example, in the case of a small liquid crystal panel.

Figure 12A:
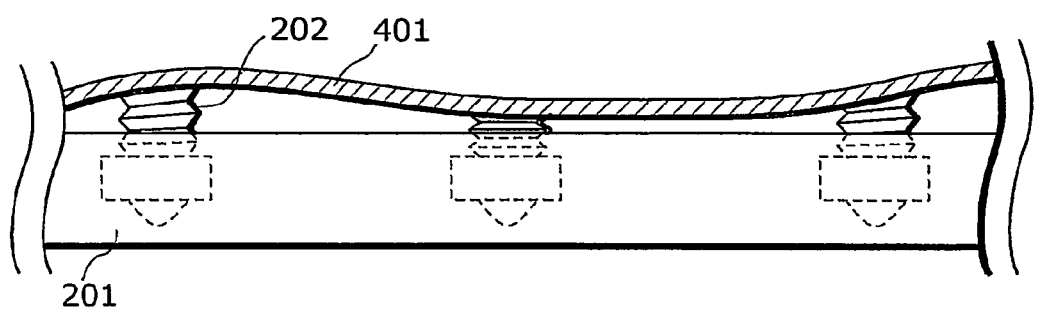
FIG. 12A and FIG. 12B are diagrams illustrating how warping of a liquid crystal panel is corrected in the warping correction unit of the substrate processing apparatus according to a second embodiment.
Figure 12B:
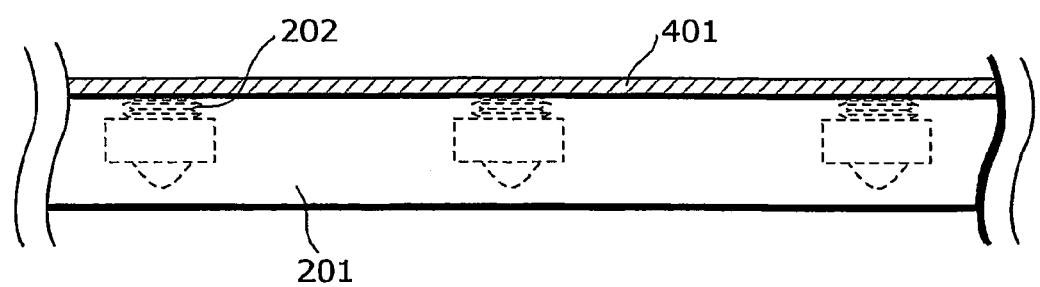

FIG. 12A and FIG. 12B are diagrams illustrating how warping of the liquid crystal panel 401 is corrected in the warping correction unit 201 of the substrate processing apparatus 1000 according to the second embodiment.

Referring to FIG. 12A, which is a side view showing the liquid crystal panel 401 before warping at its outer edge portion is corrected, the liquid crystal panel 401 is placed onto the accordion pads 202. Since such large liquid crystal panel 401 is made of plural glasses that are laminated over one another, the center of the liquid crystal panel 401 in the longitudinal direction is bended and its outer edge portion is in a wavy form as shown in FIG. 12A. The top surface of each accordion pad 202 is designed to be about 2.5 mm higher, for example, than the top surface of the warping correction unit 201 before a liquid crystal panel is placed on the warping correction unit 201. This structure makes it possible to vacuum-suck the outer edge portion of a liquid crystal panel to be placed on the warping correction unit 201 in a manner that the accordion pads 202 are reliably in contact with such liquid crystal panel according to the shape of its outer edge portion. The accordion pads 202 here are commercially available accordion pads made of rubber, and the diameter of the accordion pads 202 is, for example, about 10 mm.

Referring to FIG. 12B, which is a side view showing the liquid crystal panel 401 after the warping at its outer edge portion is corrected, it is possible to reliably correct the warping of the liquid crystal panel 401 and to maintain the flatness of its outer edge portion by vacuum-sucking the liquid crystal panel 401 using the accordion pads 202.

Figure 13A:
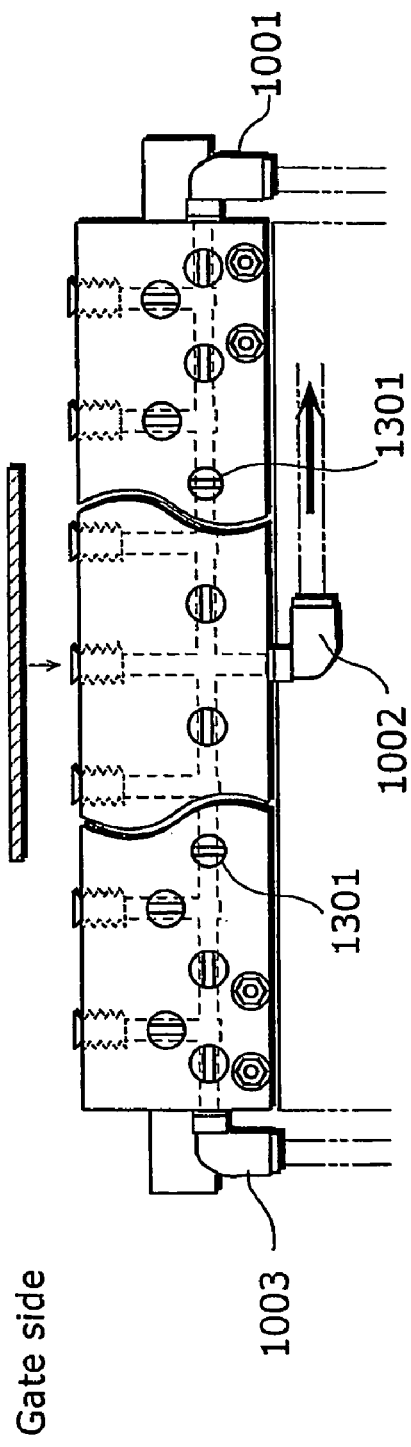
FIG. 13A and FIG. 13B are side views showing the warping correction unit of the substrate processing apparatus according to the second embodiment.
Figure 13B:
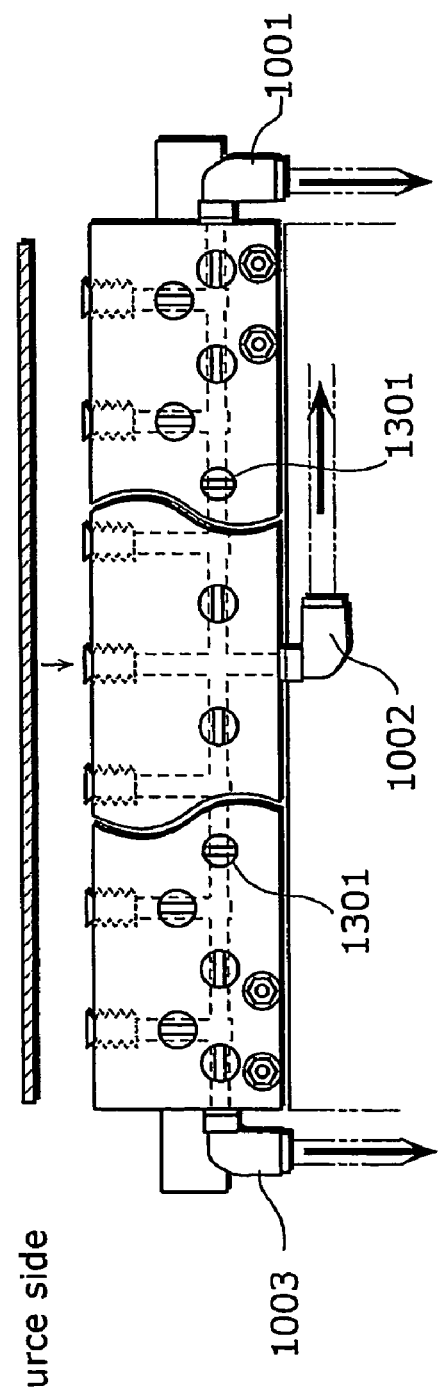

FIG. 13A and FIG. 13B are side views showing the warping correction unit of the substrate processing apparatus 1000 according to the second embodiment.

A hollow portion serving as an air circulation path includes the following hollow portions formed inside the warping correction unit 201: a hollow portion formed in a horizontal direction; and hollow portions, formed in a vertical direction, which run between the hollow portion formed in the horizontal direction and the respective suction pads. The central portion, the right end portion, and the left end portion of the hollow portion are connected to the vacuum paths 1001 to 1003.

Furthermore, air stop cocks are equipped on the hollow portion in a manner that they penetrate the hollow portion. Using the air stop cocks that include air stop cocks on which a through-hole is not formed and air passage cocks on which a through-hole is formed to allow the passage of air, it is possible to adjust the suction position of a liquid crystal panel, and by rotating the air stop cocks with through-holes by 90 degrees or by sliding them in the axial direction, it is possible to open and close the air circulation paths.

Referring to FIG. 13A, which is a side view showing the liquid crystal panel 401 in the case where the mounting process is performed for its gate sides, the controller serving as the vacuum path determination unit closes air stop cocks 1301 as appropriate according to the width of the gate sides of a liquid crystal panel, so as to interrupt the paths. The liquid crystal panel is sucked using only the vacuum path 1002 when the mounting process is performed for the gate sides.

Referring to FIG. 13B, which is a side view showing the liquid crystal panel 401 in the case where the mounting process is performed for its source side, the controller changes the vacuum path to be used to the vacuum paths 1001 to 1003 when the mounting processing is performed for the source side. By performing the suction process after such change, it is possible to suck the outer edge portion of the liquid crystal panel without causing any leakage of air and to correct warping.

Figure 14A:
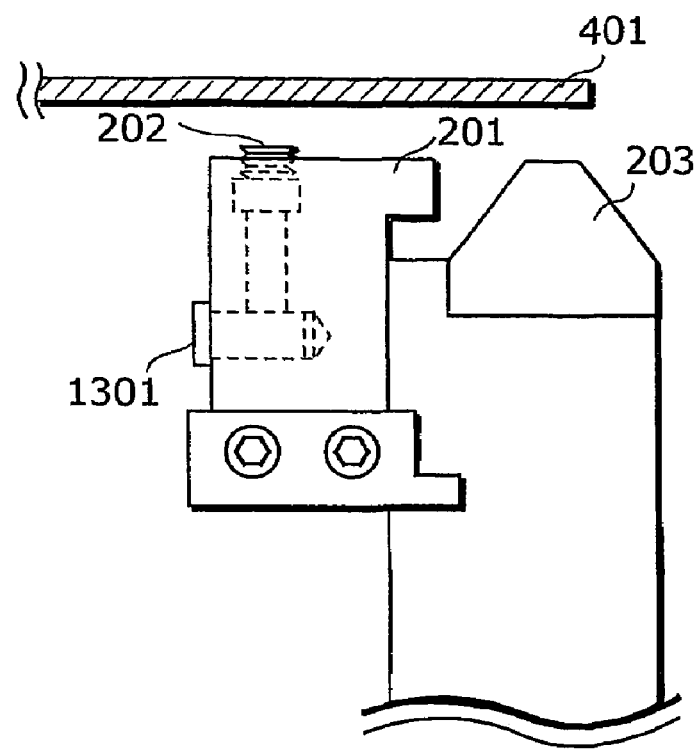
FIG. 14A and FIG. 14B are enlarged cross-sectional views in the case where air stop cocks and air passage cocks are used, respectively, in the warping correction unit.
Figure 14B:
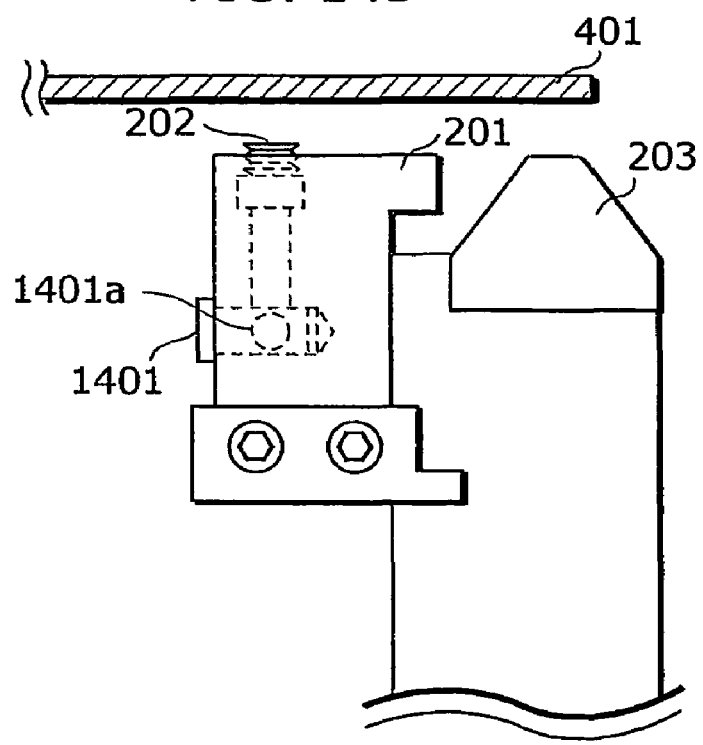

FIG. 14A and FIG. 14B are enlarged cross-sectional views in the case where the air stop cocks and air passage cocks are used, respectively, in the warping correction unit 201 according to the present invention.

Referring to FIG. 14A, which is a cross-sectional view showing the warping correction unit 201 in the case of using an air stop cock 1301, it is possible to interrupt the passage of air since such air stop cock 1301 has no through-hole. Meanwhile, referring to FIG. 14B, which is a cross-sectional view showing the warping correction unit 201 in the case of using an air passage cock 1401, the passage of air is not interrupted since a through-hole 1401a that fits the diameter of a vacuum path is formed to allow the passage of air. Note that, in addition to using these two types of cocks, i.e., air passage cocks 1401 and air stop cocks 1301 as shown in FIG. 14A and FIG. 14B, it is possible to achieve the same function by rotating one cock with a through-hole by 90 degrees or by sliding it in the axial direction.

Figure 15:
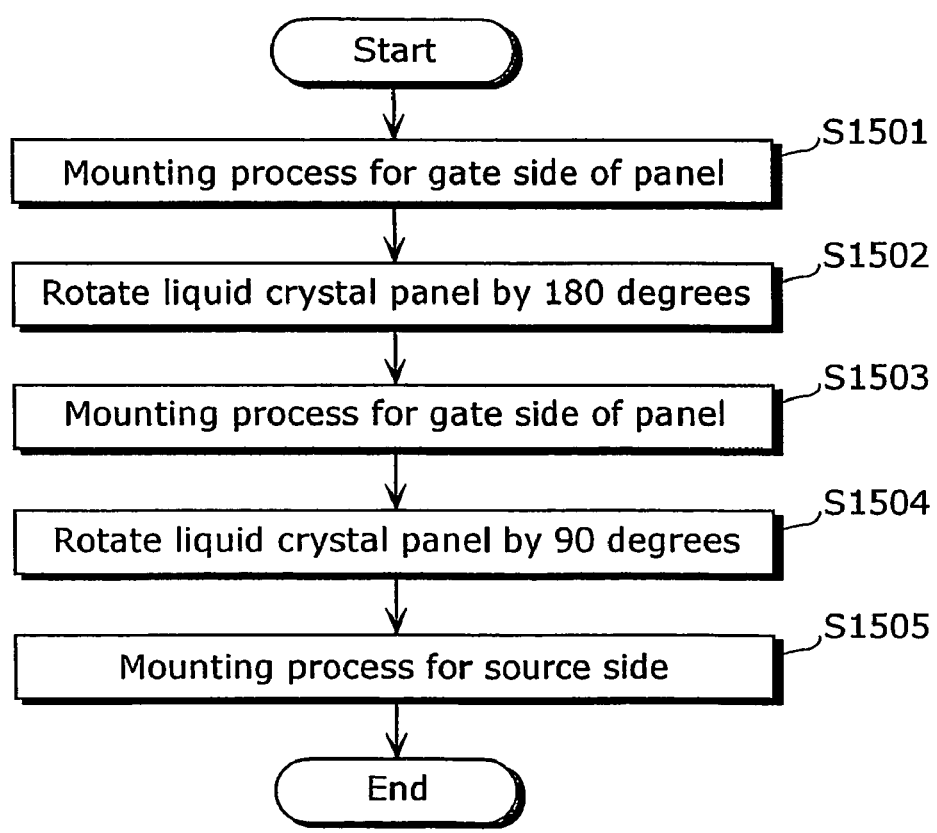
FIG. 15 is a flowchart for explaining a processing procedure taken by the substrate processing apparatus to process the gate sides and the source side of a liquid crystal panel.

FIG. 15 is a flowchart for explaining the processing procedure taken by the substrate processing apparatus 1000 according to the present invention to process the gate sides and the source side of the liquid crystal panel 401.

First, when the liquid crystal panel 401 is transported to the substrate processing apparatus 1000, the mounting process is performed for a gate side of the liquid crystal panel 401 (S1501).

Next, in the second embodiment, in order to perform the mounting process for three sides of the liquid crystal panel, the liquid crystal panel is rotated by 180 degrees using the XY stage and the panel stage (S1502), so as to perform the mounting process for the gate side on the other end (S1503).

Then, after rotating the liquid crystal panel by 90 degrees using the panel stage or the like (S1504), the mounting process is then performed for the source side of the liquid crystal panel (S1505). It should be noted that it is possible to perform the mounting process first for the source side of the liquid crystal panel.

Figure 16:
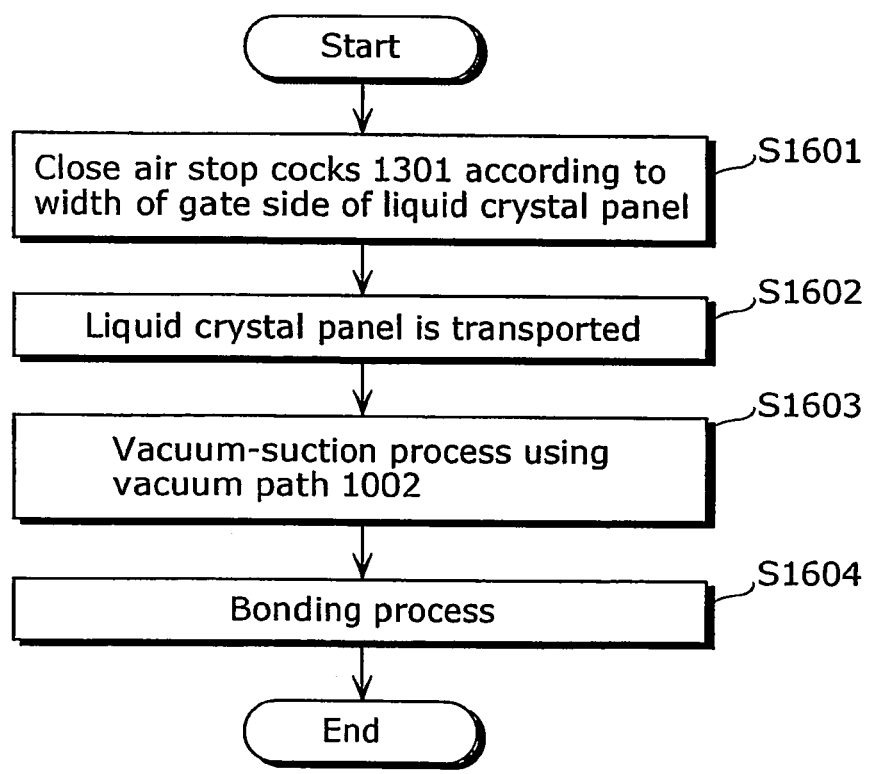
FIG. 16 is a flowchart showing an operating procedure taken by the substrate processing apparatus to correct warping at a gate side of a liquid crystal panel.

FIG. 16 is a flowchart showing the operating procedure taken by the substrate processing apparatus 1000 of the present invention to correct warping at a gate side of the liquid crystal panel 401.

First, the controller serving as the vacuum path determination unit closes air stop cocks 1301 as appropriate according to the width of the end portion of a gate side of a liquid crystal panel 401 onto which liquid crystals are to be mounted (S1601). Next, the liquid crystal panel 401 is transported using the panel stage in a manner that the outer edge portion of the liquid crystal panel 401 is placed onto the warping correction unit 201 and the backup stage 203 (S1602). Then, after warping of the liquid crystal panel 401 is corrected by sucking its outer edge portion via the accordion pads 202 that serves as the suction portions, using the vacuum path 1002 (S1603), bonding of electronic components to the liquid crystal panel 401 is carried out (S1604).

Figure 17:
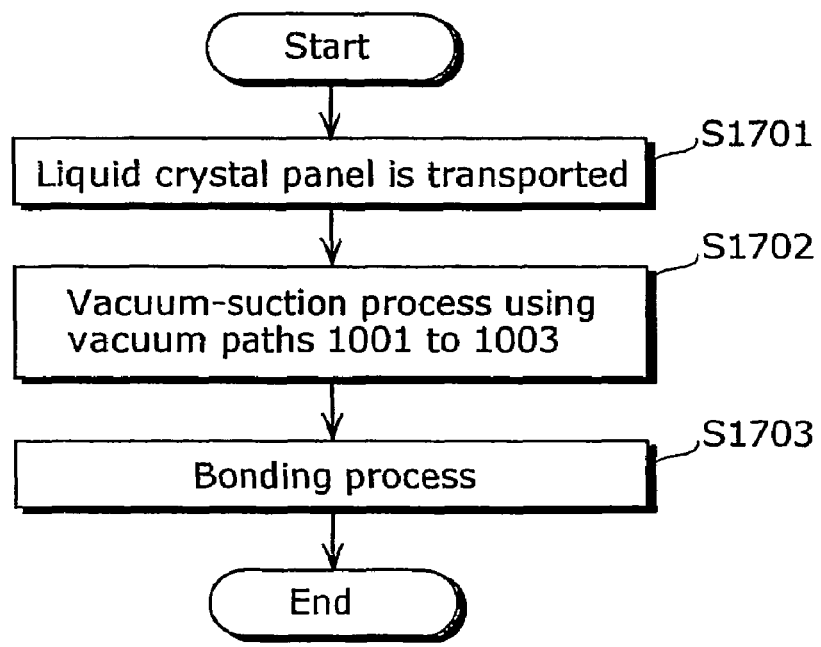
FIG. 17 is a flowchart showing an operating procedure taken by the substrate processing apparatus to correct warping at the source side of the liquid crystal panel.

FIG. 17 is a flowchart showing the operating procedure taken by the substrate processing apparatus 1000 of the present invention to correct warping at the source side of the liquid crystal panel 401.

First, the liquid crystal panel 401 is transported using the panel stage in a manner that the outer edge portion of the liquid crystal panel 401 is placed onto the warping correction unit 201 and the backup stage 203 (S1701). Then, the outer edge portion of the liquid crystal panel 401 is vacuum-sucked using the vacuum paths 1001 to 1003 determined to be used by the controller serving as the vacuum path determination unit (S1702). Finally, bonding of electronic components to the outer edge portion of the liquid crystal panel 401 is carried out (S1703).

As described above, according to the substrate processing apparatus 1000 of the present embodiment, the warping correction unit 201 is equipped in parallel with the backup stage 203 where the final bonding process is performed for the liquid crystal panel 401, and the outer edge portion of the liquid crystal panel 401 is sucked at the warping correction unit 201 using the accordion pads 202 intended for vacuum suction.

This structure makes it possible to maintain the flatness of the outer edge portion of a large liquid crystal panel 401 that is particularly subjected to warping and bending, and thus to improve the accuracy of placing electronic components in each process for a liquid crystal panel.

Furthermore, according to the substrate processing apparatus 1000 of the second embodiment, vacuum paths are provided at three locations in the warping correction unit, and the controller serving as the vacuum path determination unit changes vacuum paths to be used depending on whether the mounting process is performed for the gate sides or the source side of a liquid crystal panel. Moreover, the controller closes air stop cocks located near the end portions of the respective gate sides of the liquid crystal panel.

Thus, the above structures make it possible to improve the accuracy of substrate processing by reliably preventing air leakage or the like at the time of sucking a liquid crystal panel.

What is more, since the substrate processing apparatus 1000 of the present invention is capable of correcting warping at both the gate sides and source side simply by changing vacuum path(s) to be used, it is effective for use in an apparatus for processing the source side and the gate sides by the same single process.

Note that, in general, the final bonding process is performed using exactly the same final-bonders that are equipped in a line to perform bonding process for two sides of a liquid crystal panel, that is, one source side and one gate side. Therefore, simply by changing the setting of suction areas on a final-bonder basis, it is possible to support the long sides or the short sides of a liquid crystal panel in the case where the size of a substrate onto which electronic components are mounted changes.

Third Embodiment

The following describes another embodiment of the substrate processing apparatus 1000 of the present invention with reference to the drawings. Note that the third embodiment is characterized by its suction method to be used in the case where the length of the source side of a liquid crystal panel is shorter than the length of a suction area of the warping correction unit.

Figure 18:
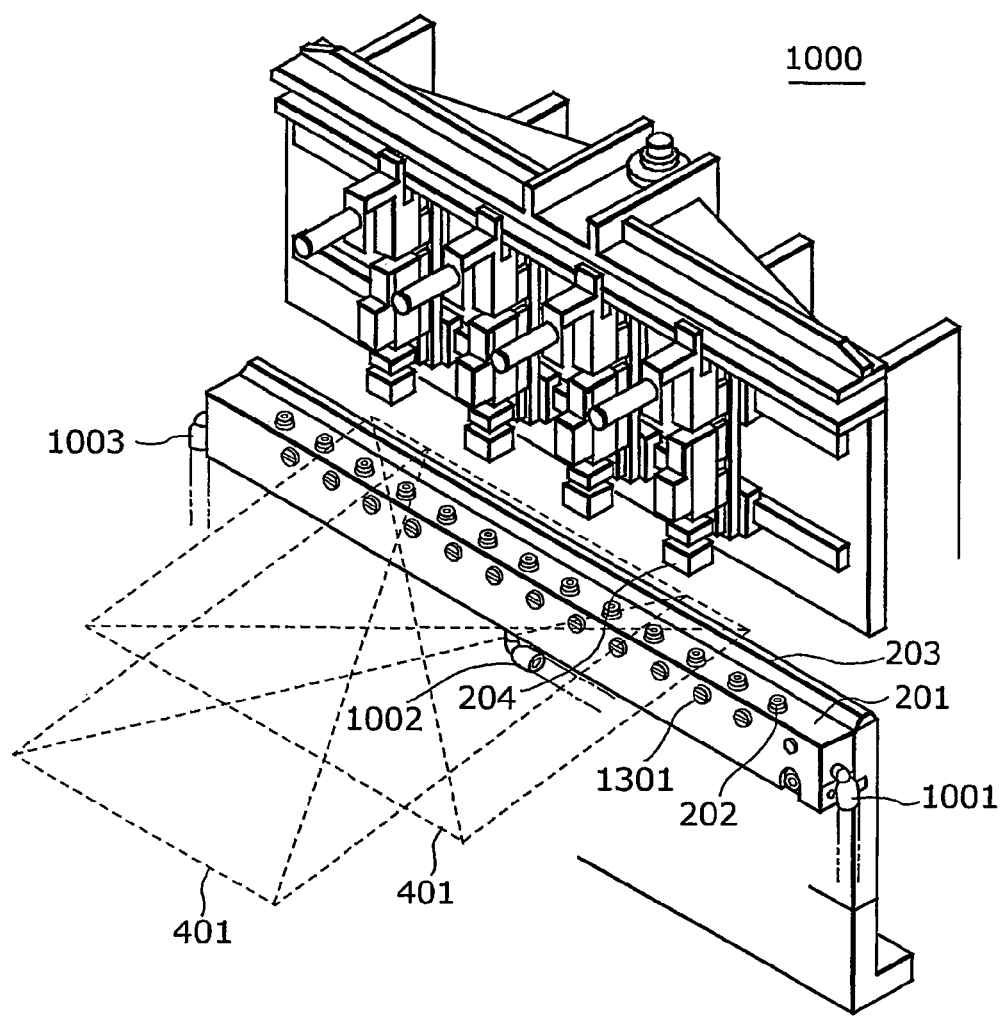
FIG. 18 is a perspective view showing the substrate processing apparatus according to a third embodiment.

FIG. 18 is a perspective view showing the substrate processing apparatus 1000 according to the third embodiment.

As marked by diagonal lines in FIG. 18, in the case where the length of the source side of the liquid crystal panel 401 is shorter than the length of the warping correction unit 201 in the longitudinal direction and where the source side of the liquid crystal panel 401 is placed on the warping correction unit 201, there are unused accordion pads 202 at both end portions of the warping correction unit 201. Note that other components of the substrate processing apparatus 1000 are the same as those shown in the above-described FIG. 10, and therefore detailed description thereof are not given.

FIG. 19A and FIG. 19B are side views showing the warping correction unit of the substrate processing apparatus 1000 according to the third embodiment.

The structures of the hollow portion serving as the air circulation path, the air stop cocks 1301 and 1902, and the vacuum paths 1001 to 1003 are the same as those shown in the above-described FIG. 13A and FIG. 13B.

Referring to FIG. 19A, which is a side view showing the warping correction unit 201 in the case where the mounting process is performed for a gate side of the liquid crystal panel 401, the passage of air is interrupted by closing air stop cocks 1301 according to the width of the gate side of the liquid crystal panel. The liquid crystal panel is sucked using only the vacuum path 1002 when the mounting process is performed for the gate sides.

Referring to FIG. 19B, which is a side view showing the warping correction unit 201 in the case where the mounting process is performed for the source side of the liquid crystal panel 401, the passage of air is interrupted by closing air stop cocks 1902 according to the width of the source side of the liquid crystal panel. Then, the controller serving as the vacuum path determination unit changes the vacuum path to be used from the one vacuum path 1002 to the vacuum paths 1001 to 1003 in the mounting process for the source side before the suction process is performed. This makes it possible to correct warping since the outer edge portion of the liquid crystal panel is sucked in an appropriate manner without causing any leakage of air from the accordion pads located at both end portions of the warping correction unit on which the liquid crystal panel is not placed.

Figure 20:
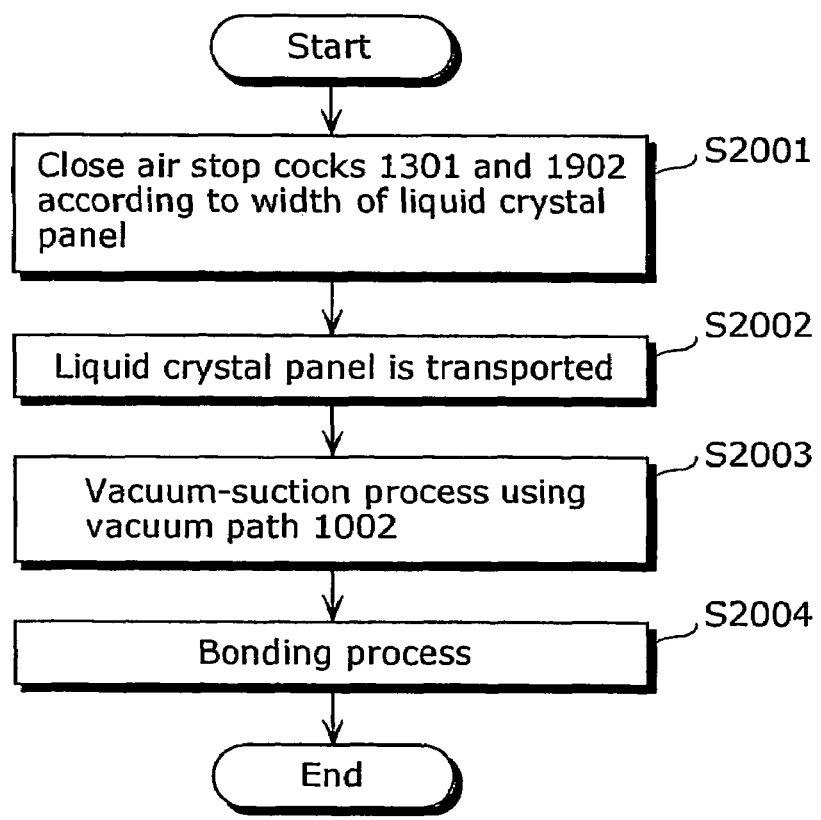
FIG. 20 is a flowchart showing an operating procedure taken by the substrate processing apparatus to correct warping at a gate side of a liquid crystal panel.

FIG. 20 is a flowchart showing the operating procedure taken by the substrate processing apparatus 1000 of the present invention to correct warping at a gate side of the liquid crystal panel 401.

First, air stop cocks 1301 located at the end portions of an area including accordion pads 202 used for vacuum suction are closed according to the width of a gate side of the liquid crystal panel 401 onto which liquid crystal drivers are mounted. Furthermore, air stop cocks 1902 located at the both end portions of the source side are closed according to the length of the source side of the liquid crystal panel (S2001).

The subsequent processes performed in S2002 to S2004 are the same as those of S1602 to S1604 shown in FIG. 16 of the second embodiment, and therefore descriptions thereof are not given.

Figure 21:
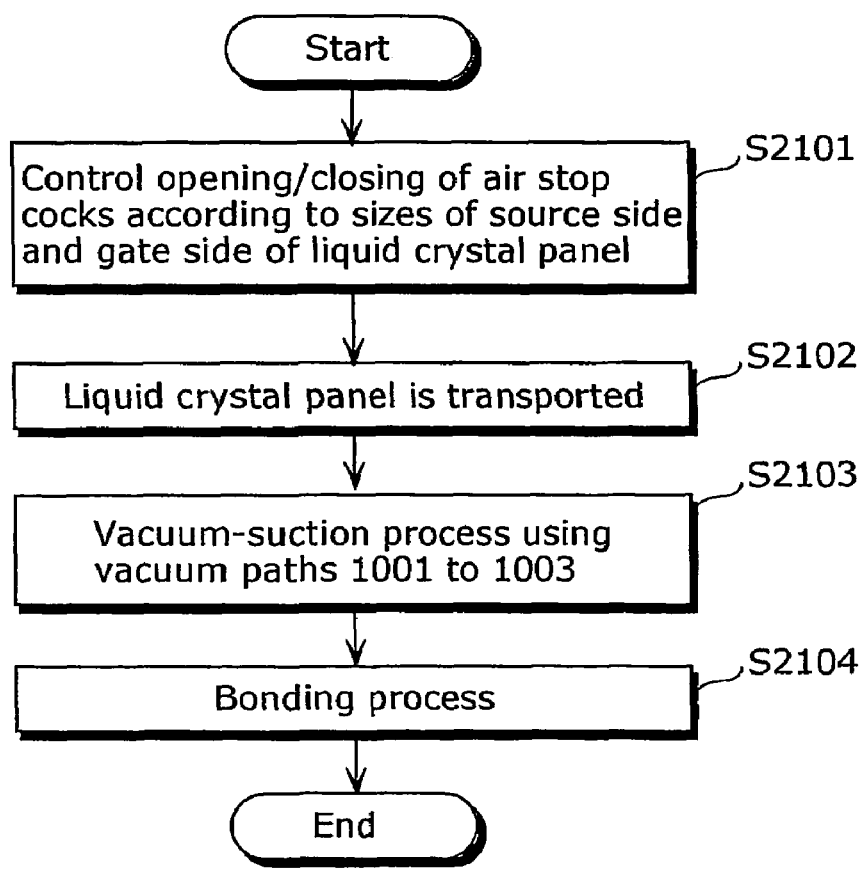
FIG. 21 is a flowchart showing an operating procedure taken by the substrate processing apparatus to correct warping at the source side of the liquid crystal panel.

FIG. 21 is a flowchart showing the operating procedure taken by the substrate processing apparatus 1000 of the present invention to correct warping at the source side of the liquid crystal panel 401.

First, the air stop cocks 1301 located at the end portion of an area including accordion pads 202 used for vacuum suction are closed according to the width of a gate side of the liquid crystal panel 401 onto which liquid crystal drivers are mounted. Furthermore, the air stop cocks 1902 located at the both end portions of the source side are closed according to the length of the source side of the liquid crystal panel (S2101). The subsequent processes performed in S2102 to S2104 are the same as those of S1702 to S1704 shown in the above-described FIG. 17, and therefore descriptions thereof are not given.

As described above, even in the case where the length of the source side of the liquid crystal panel 401 is shorter than the length of a suction area of the warping correction unit 201, the substrate processing apparatus 1000 according to the third embodiment is capable of preventing the leakage of air from suction pads located in portions on which the liquid crystal panel 401 is not placed, by interrupting the passage of air by closing not only air stop cocks 1301 but also air stop cocks 1902 as well as capable of processing the gate sides and the source side of the liquid crystal panel 401 by the same single apparatus in an appropriate manner, in addition to producing the effect achieved by the second embodiment.

Figure 22:
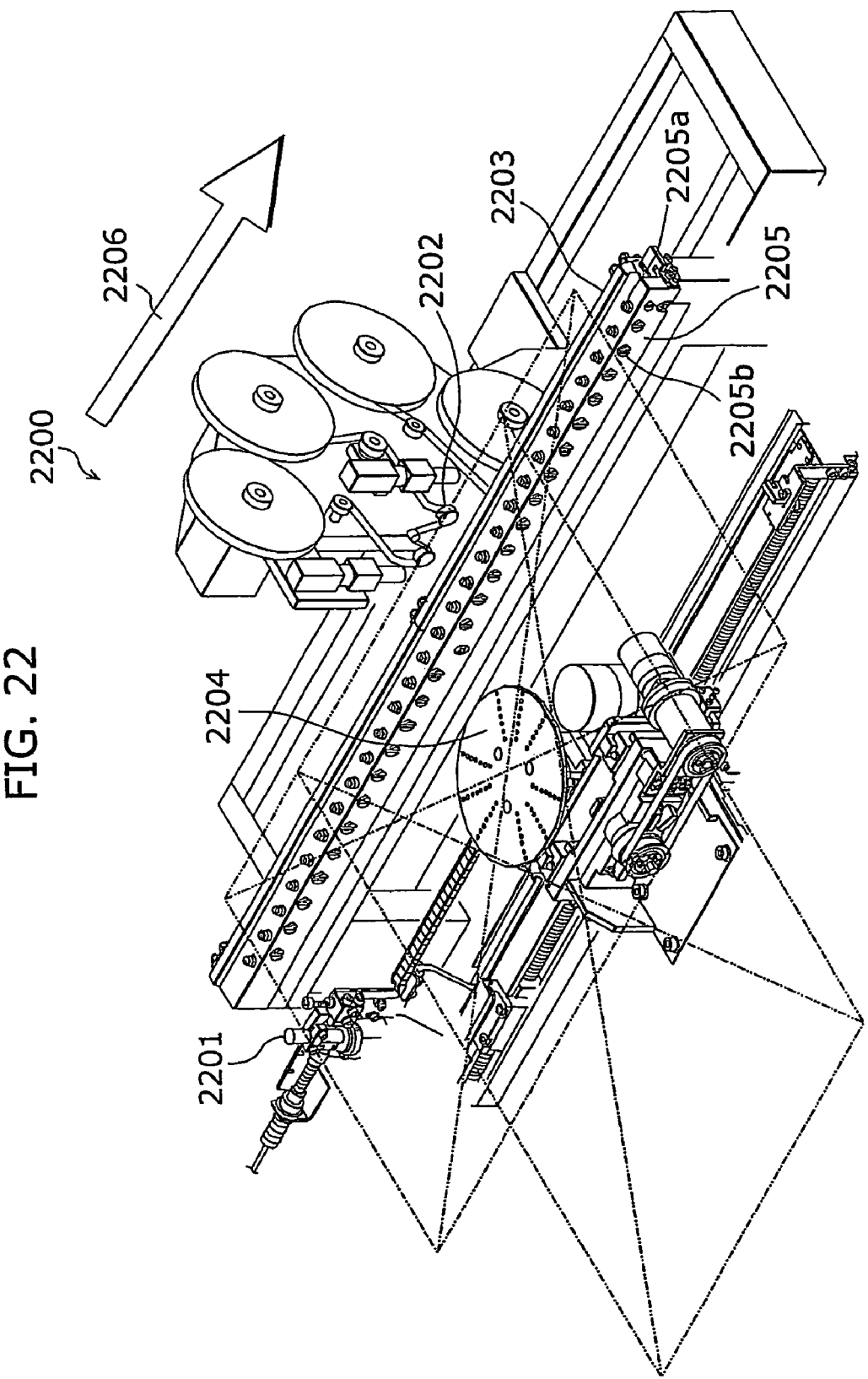
FIG. 22 is an external view showing a terminal cleaner that is equipped with a warping correction unit according to the present invention.

FIG. 22 is an external view showing a terminal cleaner 2200 that is equipped with a warping correction unit 2205 according to the present invention.

The terminal cleaner 2200 is an apparatus for cleaning the top and bottom surfaces of the outer edge portion onto which electronic components are mounted, prior to the process of mounting electronic components onto a liquid crystal panel. Such terminal cleaner 2200 is equipped with: a recognition camera 2201 that takes an image of a position of the liquid crystal panel for the purpose of correcting the position of the liquid crystal panel; a cleaning head 2202 that cleans the outer edge portion of the liquid crystal panel using a cleaning cloth; a backup stage 2203 on which the periphery of the outer edge portion of the liquid crystal panel to be cleaned is placed; a panel stage 2204 that (i) determines the position of the liquid crystal panel in the X direction, Y direction, Z direction, and θ direction, (ii) changes the position of the liquid crystal panel to its gate side or source side by rotating the liquid crystal panel, and (iii) holds fixedly the liquid crystal panel placed thereon by vacuum suction while cleaning is taking place; and a warping correction unit 2205 that corrects warping at the outer edge portion of the liquid crystal panel while cleaning is taking place; or the like.

As in the case of the above described embodiments, the warping correction unit 2205 is equipped with suction pads 2205a for correcting warping of the liquid crystal panel and air stop cocks 2205b and air passage cocks used to change the size of a suction area according to the size of a liquid crystal panel. The size of a suction area is changed in processes for the source side and the gate sides of the liquid crystal panel according to a determination made by the controller as to which vacuum path(s) should be used.

This structure makes it possible for the terminal cleaner 2200 to perform, in the same single apparatus, the cleaning of the source side and the gate sides, while correcting warping at the outer edge portion in the warping correction unit 2205.

The substrate processing apparatus of the present invention has been described in the above embodiments on the assumption that it is directed to performing the placement process for the gate sides and the source side in the same single final-bonder or terminal cleaner, but it should be noted that the substrate processing apparatus of the present invention may be used, for example, for apparatuses such as a lead checker that is used after bonding of electronic components is performed.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The mounter according to the present invention is particularly applicable for use in the ACF bonding process, pre-bonding process, and final bonding process performed in a liquid crystal driver mounter that mounts semiconductor components onto a large liquid crystal panel, as well as applicable for use in a terminal cleaner and a lead checker, or the like to be used before and after the above processes.

The invention claimed is:

1. A substrate processing apparatus for use in a process of mounting electronic components onto an outer edge portion of a substrate, said apparatus comprising:
    a suction stage including (i) suction portions for sucking an undersurface of the outer edge portion of the substrate, and (ii) a flat portion for correcting warping at the undersurface of the outer edge portion of the substrate;
    vacuum paths connected to said suction stage;
    a vacuum-suction unit operable to vacuum-suck the outer edge portion of the substrate to be placed on said suction stage using said suction portions, said vacuum-suction unit being connected to at least one of said vacuum paths;
    a substrate transportation unit operable to hold and move the substrate, and to place the outer edge portion of the substrate on said suction stage;
    a hollow portion for connecting said vacuum paths and said suction portions, said hollow portion being formed inside said suction stage;
    an opening and closing unit operable to open and close said hollow portion; and
    a backup stage that is a placement stage for supporting the undersurface of the outer edge portion of the substrate, wherein the longitudinal length of said suction stage is the same as the longitudinal length of said backup stage.

2. A substrate processing apparatus for use in a process of mounting electronic components onto an outer edge portion of a substrate, said apparatus comprising:

a suction stage including (i) suction portions for sucking an undersurface of the outer edge portion of the substrate, and (ii) a flat portion for correcting warping at the undersurface of the outer edge portion of the substrate;

vacuum paths connected to said suction stage;

a vacuum-suction unit operable to vacuum-suck the outer edge portion of the substrate to be placed on said suction stage using said suction portions, said vacuum-suction unit being connected to at least one of said vacuum paths;

a substrate transportation unit operable to hold and move the substrate, and to place the outer edge portion of the substrate on said suction stage;

a hollow portion for connecting said vacuum paths and said suction portions, said hollow portion being formed inside said suction stage; and an opening and closing unit operable to open and close said hollow portion, wherein said hollow portion is made up of the following hollow portions formed inside said suction stage: (i) a first hollow portion that is formed horizontally traversing said suction stage, and (ii) second hollow portions that are formed vertically to said suction stage to connect said first hollow portion and said suction portions, and wherein said opening and closing unit is made up of: (i) first stop cocks equipped on said first hollow portion at predetermined intervals, and (ii) second stop cocks equipped on said respective second hollow portions.

3. The substrate processing apparatus according to claim 2, wherein said opening and closing unit is constituted by air passage cocks equipped in a manner such that said air passage cocks penetrate said hollow portion, each of said air passage cocks having a through-hole at a position that corresponds to a position of said hollow portion such that opening and closing of each of said suction portions is controlled.

4. The substrate processing apparatus according to claim 3, wherein said vacuum paths include the following vacuum paths connected to the hollow portion: (i) a first vacuum path that is located in a central portion of said suction stage in the longitudinal direction, and (ii) second vacuum paths, one of which is located at a right end portion of said suction stage and the other of which is located at a left end portion of said suction stage, and wherein said substrate processing apparatus further comprises a vacuum path determination unit operable to determine a vacuum path to be used from said first vacuum path and second vacuum paths depending on whether processing is performed on a short side or a long side of the substrate.

5. A mounter that mounts electronic components onto a liquid crystal panel, said mounter comprising:

a pressure head that pressurizes the electronic components to an outer edge portion of the liquid crystal panel;

a backup stage that is a placement stage for supporting, from the back, the outer edge portion of the liquid crystal panel when said pressure head pressurizes the electronic components;

a suction stage that is equipped close to and in parallel with said backup stage, and that includes suction portions for sucking the outer edge portion of the liquid crystal panel;

vacuum paths that are connected to said suction stage;

a vacuum-suction unit operable to vacuum-suck the liquid crystal panel to be placed on said suction stage, said vacuum-suction unit being connected to said suction stage via at least one of said vacuum paths;

a substrate transportation unit operable to hold and move the substrate, and to place the outer edge portion of the substrate on said suction stage;

a hollow portion for connecting said vacuum paths and said suction portions, said hollow portion being formed inside said suction stage; and an opening and closing unit operable to open and close said hollow portion, wherein the longitudinal length of said suction stage is the same as the longitudinal length of said backup stage.

6. A mounter that mounts electronic components onto a liquid crystal panel, said mounter comprising:

a pressure head that pressurizes the electronic components to an outer edge portion of the liquid crystal panel;

a backup stage that is a placement stage for supporting, from the back, the outer edge portion of the liquid crystal panel when said pressure head pressurizes the electronic components;

a suction stage that is equipped close to and in parallel with said backup stage, and that includes suction portions for sucking the outer edge portion of the liquid crystal panel;

vacuum paths that are connected to said suction stage;

a vacuum-suction unit operable to vacuum-suck the liquid crystal panel to be placed on said suction stage, said vacuum-suction unit being connected to said suction stage via at least one of said vacuum paths;

a substrate transportation unit operable to hold and move the substrate, and to place the outer edge portion of the substrate on said suction stage;

a hollow portion for connecting said vacuum paths and said suction portions, said hollow portion being formed inside said suction stage; and an opening and closing unit operable to open and close said hollow portion, wherein said hollow portion is made up of the following hollow portions formed inside said suction stage: (i) a first hollow portion that is formed horizontally traversing said suction stage, and (ii) second hollow portions that are formed vertically to said suction stage to connect said first hollow portion and said suction portions, and wherein said opening and closing unit is made up of: first stop cocks equipped on said first hollow portion at predetermined intervals; and second stop cocks equipped on said respective second hollow portions.

7. The mounter according to claim 6, wherein said opening and closing unit is constituted by air passage cocks equipped in a manner such that said air passage cocks penetrate said hollow portion, each of said air passage cocks having a through-hole at a position that corresponds to a position of said hollow portion such that opening and closing of each of said suction portions is controlled.

8. The mounter according to claim 7, wherein said vacuum paths include the following vacuum paths connected to the hollow portion: (i) a first vacuum path that is located in a central portion of said suction stage in the longitudinal direction, and (ii) second vacuum paths, one of which is located at a right end portion of said suction stage and the other of which is located at a left end portion of said suction stage, and wherein said mounter further comprises a vacuum path determination unit operable to determine a vacuum path to be used from said first vacuum path and second vacuum paths depending on whether processing is performed on a short side or a long side of the liquid crystal panel.

9. A substrate processing method for use with a substrate processing apparatus that is used in a process of mounting electronic components onto an outer edge portion of a substrate, wherein the substrate processing apparatus includes:

a suction stage including (i) suction portions for sucking an undersurface of the outer edge portion of the substrate, and (ii) a flat portion for correcting warping at the undersurface of the outer edge portion of the substrate;

vacuum paths connected to the suction stage;

a vacuum-suction unit operable to vacuum-suck the outer edge portion of the substrate to be placed on the suction stage using the suction portions, the vacuum-suction unit being connected to at least one of the vacuum paths; and a substrate transportation unit operable to hold and move the substrate, and to place the outer edge portion of the substrate on the suction stage;

wherein a hollow portion is formed inside the suction stage, the hollow portion being made up of the following hollow portions: (i) a first hollow portion that is formed horizontally traversing the suction stage, and (ii) second hollow portions that are formed vertically to the suction stage to connect the first hollow portion and the suction portions, wherein the vacuum paths include the following vacuum paths connected to the hollow portion: (i) a first vacuum path that is located in a central portion of the suction stage in the longitudinal direction, and (ii) second vacuum paths, one of which is located at a right end portion of the suction stage and the other of which is located at a left end portion of the suction stage, wherein the substrate processing apparatus further includes an opening and closing unit operable to open and close the hollow portion, the opening and closing unit being made up of the following stop cocks: (i) first stop cocks equipped on the first hollow portion at predetermined intervals, and (ii) second stop cocks equipped on the respective second hollow portions, and wherein the substrate processing apparatus further includes a vacuum path determination unit operable to determine a vacuum path to be used from the first vacuum path and second vacuum paths depending on whether processing is performed on a short side or a long side of the substrate;

said substrate processing method comprising:

placing the substrate onto the suction stage;

vacuum-sucking the outer edge portion of the substrate placed on the suction stage, said vacuum-sucking being executed in a state of being connected with the suction portions;

opening and closing the first stop cocks or the second stop cocks depending on a size of the substrate; and determining a vacuum path to be used from the first vacuum path and second vacuum paths.

10. A mounting method for use with a mounter that mounts electronic components onto a liquid crystal panel, wherein the mounter includes:

a pressure head that pressurizes the electronic components to an outer edge portion of the liquid crystal panel;

a backup stage that is a placement stage for supporting, from the back, the outer edge portion of the liquid crystal panel when the pressure head pressurizes the electronic components;

a suction stage that is equipped close to and in parallel with the backup stage, and that includes suction portions for sucking the outer edge portion of the liquid crystal panel;

vacuum paths that are connected to the suction stage;

a vacuum-suction unit operable to vacuum-suck the liquid crystal panel to be placed on the suction stage, the vacuum-suction unit being connected to the suction portions; and a substrate transportation unit operable to hold and move the substrate, and to place the outer edge portion of the substrate on said suction stage, wherein a hollow portion is formed inside the suction stage, the hollow portion being made up of the following hollow portions: (i) a first hollow portion that is formed horizontally traversing the suction stage, (ii) and second hollow portions that are formed vertically to the suction stage to connect the first hollow portion and the suction portions, wherein the vacuum paths include the following vacuum paths connected to the hollow portion: (i) a first vacuum path that is located in a central portion of the suction stage in the longitudinal direction, (ii) and second vacuum paths, one of which is located at a right end portion of the suction stage and the other of which is located at a left end portion of the suction stage, wherein the mounter further includes an opening and closing unit operable to open and close the hollow portion, the opening and closing unit being made up of the following stop cocks: (i) first stop cocks equipped on the first hollow portion at predetermined intervals, and (ii) second stop cocks equipped on the respective second hollow portions, and wherein the mounter further includes a vacuum path determination unit operable to determine a vacuum path to be used from the first vacuum path and second vacuum paths depending on whether processing is performed on a short side or a long side of the liquid crystal pane;

said mounting method comprising:

placing the liquid crystal panel onto the backup stage and the suction stage;

vacuum-sucking the outer edge portion of the liquid crystal panel placed on the suction stage, said vacuum-sucking being executed in a state of being connected with the suction portions;

opening and closing the first stop cocks or the second stop cocks depending on a size of the liquid crystal pane; and determining a vacuum path to be used from the first vacuum path and second vacuum paths.

\* \* \* \* \*